United States Patent
Brown et al.

[11] Patent Number: 6,034,388
[45] Date of Patent: Mar. 7, 2000

[54] DEPLETED POLYSILICON CIRCUIT ELEMENT AND METHOD FOR PRODUCING THE SAME

[75] Inventors: Jeffrey S. Brown, Middlesex; Robert J. Gauthier, Jr., Burlington; Steven H. Voldman, South Burlington, all of Vt.

[73] Assignee: International Business Machines Corporation, Armonk, N.Y.

[21] Appl. No.: 09/079,846

[22] Filed: May 15, 1998

[51] Int. Cl.[7] ................................................. H01L 29/76
[52] U.S. Cl. ........................... 257/296; 257/336; 257/337; 257/344; 257/349; 257/308; 257/312; 257/355; 257/907
[58] Field of Search ..................................... 257/355, 356, 257/219, 336, 337, 343, 344, 349, 408, 412, 901, 296

[56] References Cited

U.S. PATENT DOCUMENTS

| | | |
|---|---|---|
| 4,075,045 | 2/1978 | Rideout . |
| 4,167,018 | 9/1979 | Ohba et al. . |
| 4,805,071 | 2/1989 | Hutter et al. . |
| 4,812,885 | 3/1989 | Riemenschneider . |
| 4,914,497 | 4/1990 | Kondo . |
| 4,914,546 | 4/1990 | Alter . |
| 5,109,258 | 4/1992 | Redwine . |
| 5,244,825 | 9/1993 | Coleman et al. . |
| 5,286,992 | 2/1994 | Ahrens et al. ........................... 257/356 |
| 5,407,841 | 4/1995 | Liao et al. ................................... 148/9 |
| 5,618,688 | 4/1997 | Reuss et al. ............................. 257/378 |
| 5,622,887 | 4/1997 | Miwa et al. . |
| 5,760,043 | 6/1998 | Pan .......................................... 257/315 |
| 5,783,850 | 7/1997 | Lian et al. ................................ 257/355 |
| 5,789,790 | 8/1998 | Morishita et al. ....................... 257/370 |
| 5,793,089 | 8/1998 | Fulford et al. ........................... 257/408 |
| 5,817,536 | 10/1998 | Nayak et al. .............................. 438/17 |
| 5,821,591 | 10/1998 | Krautschneider et al. ............. 257/359 |

*Primary Examiner*—Fetsum Abraham
*Attorney, Agent, or Firm*—Ratner & Prestia; Eugene I. Shkurko

[57] ABSTRACT

A circuit element comprising a semiconductor substrate. A well region of a first conductivity type is formed in a surface of the substrate. A dielectric film is formed on the substrate. A gate conductor of the first conductivity type is formed on the dielectric film over the well region of the substrate. The gate conductor is formed of a polycrystalline silicon film. The gate conductor has an impurity concentration substantially lower than a standard impurity concentration for the gate conductor of an MOS device. A polycrystalline silicon edge spacer is formed on each side of the gate conductor. A first pair of first conductivity type impurity diffusion regions are formed adjacent to the polycrystalline silicon edge spacers. The polycrystalline silicon film and edge spacers lie on a portion of the substrate between the first pair of first conductivity type impurity diffusion regions. The first pair of first conductivity type impurity diffusion regions have an impurity concentration substantially lower than the standard impurity concentration for the gate conductor of an MOS device. The gate conductor and the first pair of first conductivity type impurity diffusion regions may be formed by a single implantation step. Applications include ESD protection, analog applications, peripheral input/output circuitry, decoupling capacitors, and resistor ballasting.

15 Claims, 30 Drawing Sheets

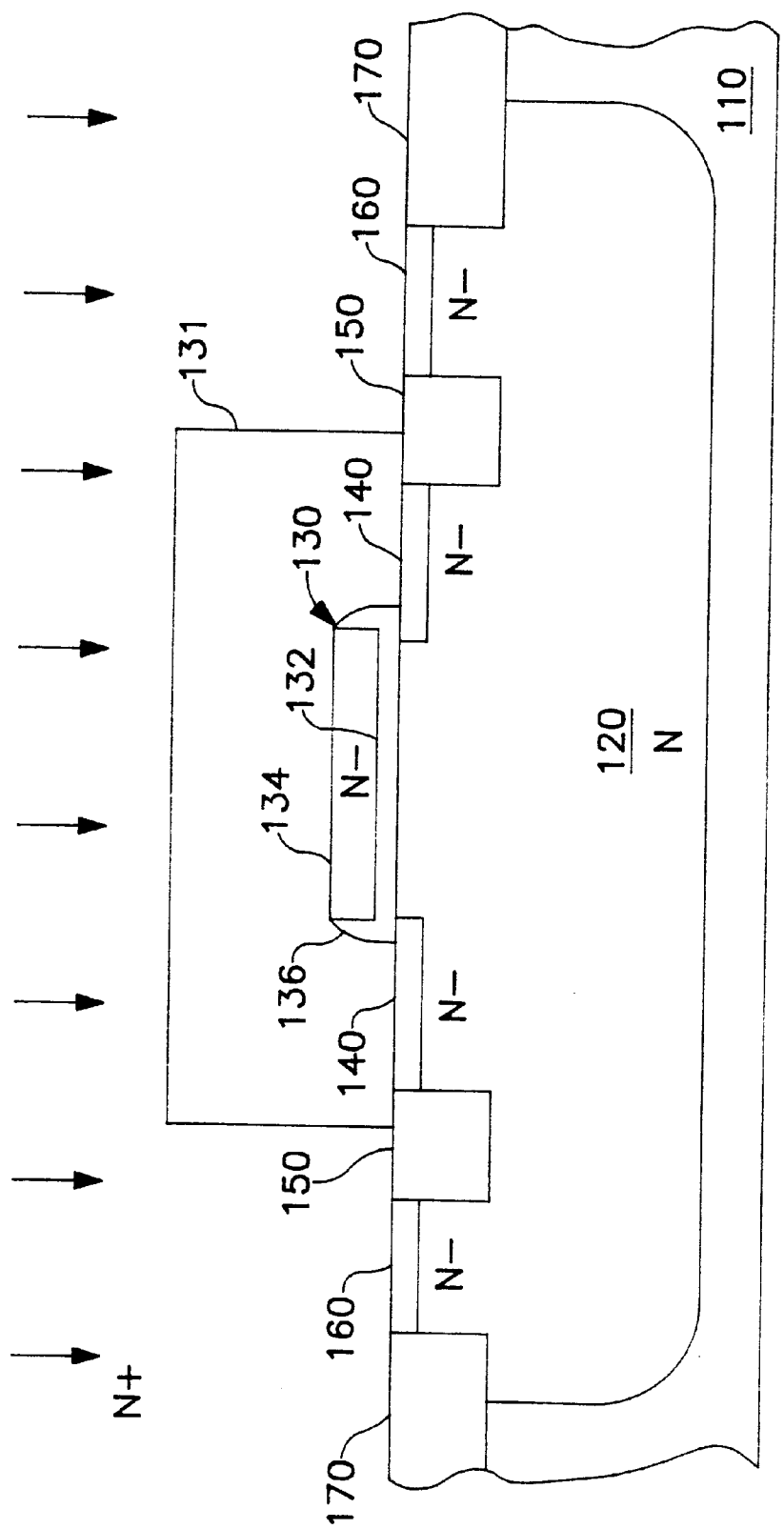
FIG. IA

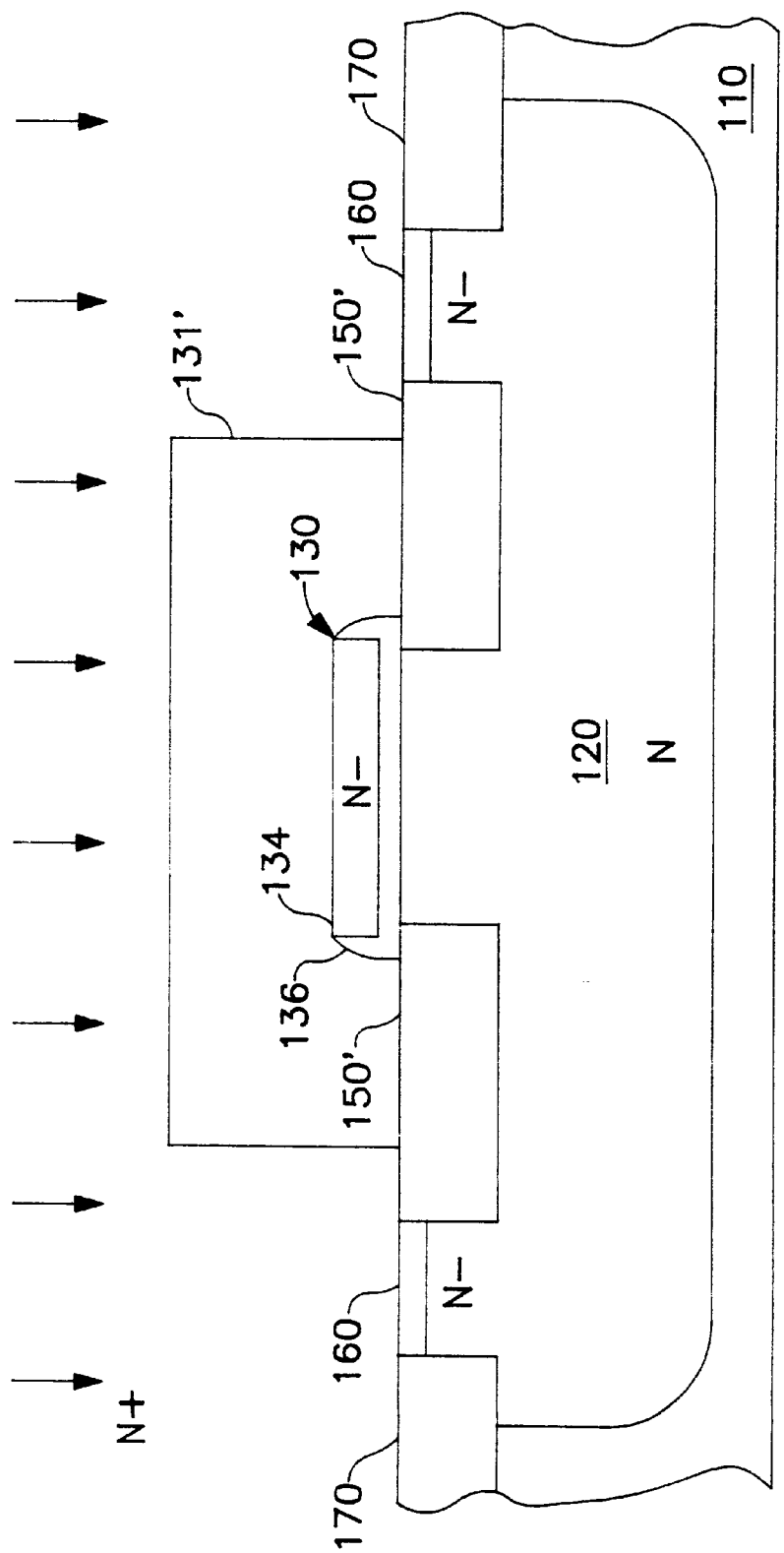
FIG. IC

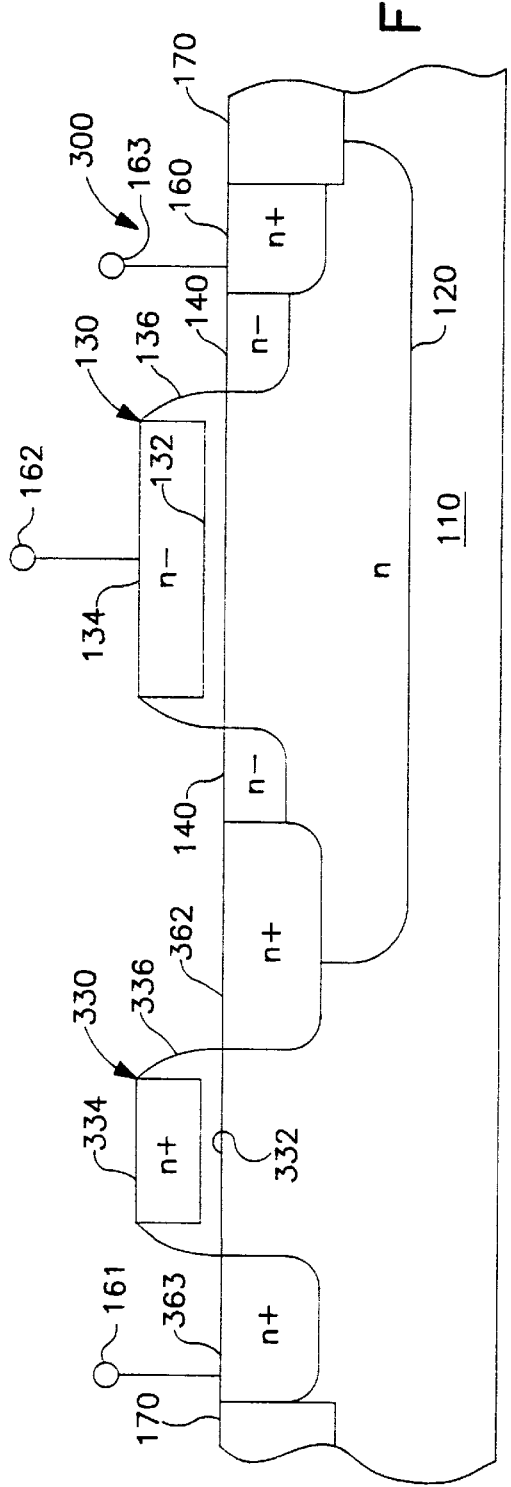
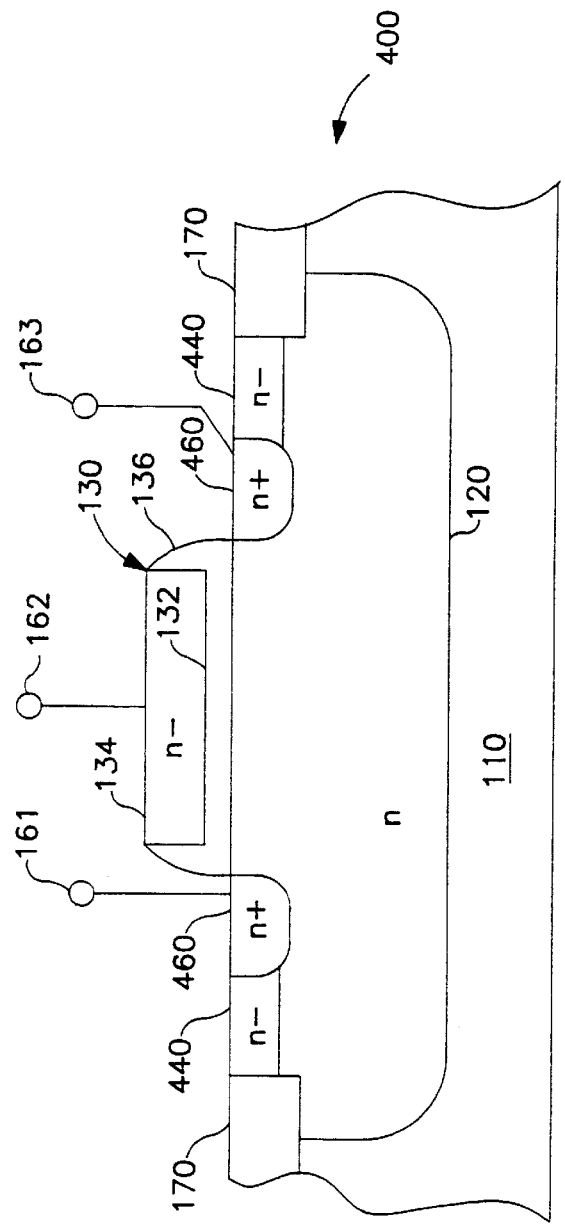
FIG. 3
FIG. 4

DEPLETED POLYSILICON CIRCUIT ELEMENT AND METHOD FOR PRODUCING THE SAME

FIELD OF THE INVENTION

This invention relates to resistor and capacitor structures and circuit elements and a method of fabricating the elements.

BACKGROUND OF THE INVENTION

On-chip resistor and capacitor elements are used in many circuit applications. For example, capacitor elements can be used in internal and peripheral circuitry, and Electrostatic Discharge (ESD) networks. Peripheral circuits of semiconductor chips use capacitors for coupling and de-coupling of drivers, receivers, and power busses.

Decoupling capacitors are used on peripheral circuit power busses for noise stabilization, dampening and other applications. Standard decoupling capacitors are implemented into advanced semiconductor chips between the power rails for the standard power supply voltage "Vdd" and the substrate ground potential "Vss," in order to reduce noise when a chip is in operation. This capacitance is added using normal thin oxide devices with heavily doped silicon gate structures. Decoupling capacitor networks are provided with control circuitry to enable and disable capacitor structures. Decoupling capacitors have been applied with fuse elements, an electronic switch (B. Krauter et al., U.S. Pat. No. 5,506,457) and other circuit implementations.

Polysilicon-to-silicon capacitors are typically placed over a heavily doped implanted silicon region. Polysilicon-to-silicon capacitors are also designed over well structures. Capacitors can consist of a gate structure placed on a well or a substrate region. U.S. Pat. No. 4,914,546 (hereafter "Alter") shows a heavily doped polysilicon gate structure over an n+ diffusion implant. Additionally, Alter shows that a heavily doped polysilicon film may be placed over a second heavily doped polysilicon film to construct a polysilicon-to-polysilicon capacitor.

U.S. Pat. No. 4,167,018 to Ohba et al. shows a heavily doped polysilicon gate structure over a well, wherein the well is placed in a substrate. U.S. Pat. No. 4,914,497 to Kondo provides an MIS capacitor using an oxidation resist film as a dielectric material on a doped region. U.S. Pat. No. 5,244,825 to Coleman et al. Shows a heavily doped polysilicon gate structure over an n+ diffusion implant. Additionally, Coleman et al. show that a heavily doped polysilicon film can be placed over a second heavily doped polysilicon film to construct a polysilicon-to-polysilicon capacitor.

As gate oxide films scale to thinner dielectric films, the dielectric becomes less tolerant of overvoltage conditions. Oxide breakdown, measured by the charge-to-breakdown, decreases with dielectric scaling. Inter-dielectric film thicknesses are also decreasing, making circuitry more sensitive to voltage stressing, and electrical overstress (EOS) and electrostatic discharge (ESD) phenomena. This is a concern in metal oxide semiconductor field effect transistor (MOSFET) structures which must interface with voltages above the native voltage of the semiconductor process.

Overvoltage conditions are of particular concern in decoupling capacitors placed on the Input/Output (I/O) power rail.

SUMMARY OF THE INVENTION

The present invention is a circuit element, comprising a semiconductor substrate. A well region of a first conductivity type is formed in a surface of the substrate. A dielectric film is formed on the substrate. A gate conductor of the first conductivity type is formed on the dielectric film over the well region of the substrate. The gate conductor is formed of a polycrystalline silicon film. The gate conductor has an impurity concentration substantially lower than a standard impurity concentration for the gate conductor of an MOS device.

According to another aspect of the invention, a capacitor element comprises a semiconductor substrate having a surface. A first dielectric film is formed on the surface of the substrate. A first polycrystalline silicon conductor is formed on the first dielectric film. A second dielectric film is formed on the first polycrystalline silicon conductor. A second polycrystalline silicon conductor is formed on the second dielectric film. One of the group consisting of the first and second polycrystalline silicon conductors has an impurity concentration substantially lower than a standard impurity concentration for the gate conductor of an MOS device.

BRIEF DESCRIPTION OF THE DRAWINGS

FIG. 1A is a diagram showing the implantation process for forming a first exemplary depleted polysilicon capacitor according to the invention.

FIG. 1C is a diagram showing the implantation process for forming a variation of the first exemplary depleted polysilicon capacitor shown in FIG. 1B.

FIG. 3 is a cross-sectional view of a circuit including a MOSFET switch and a capacitive element as shown in FIG. 2A.

FIG. 4 is a depleted polysilicon capacitive element formed using a hybrid resist edge implant.

OVERVIEW

Figure 1B:
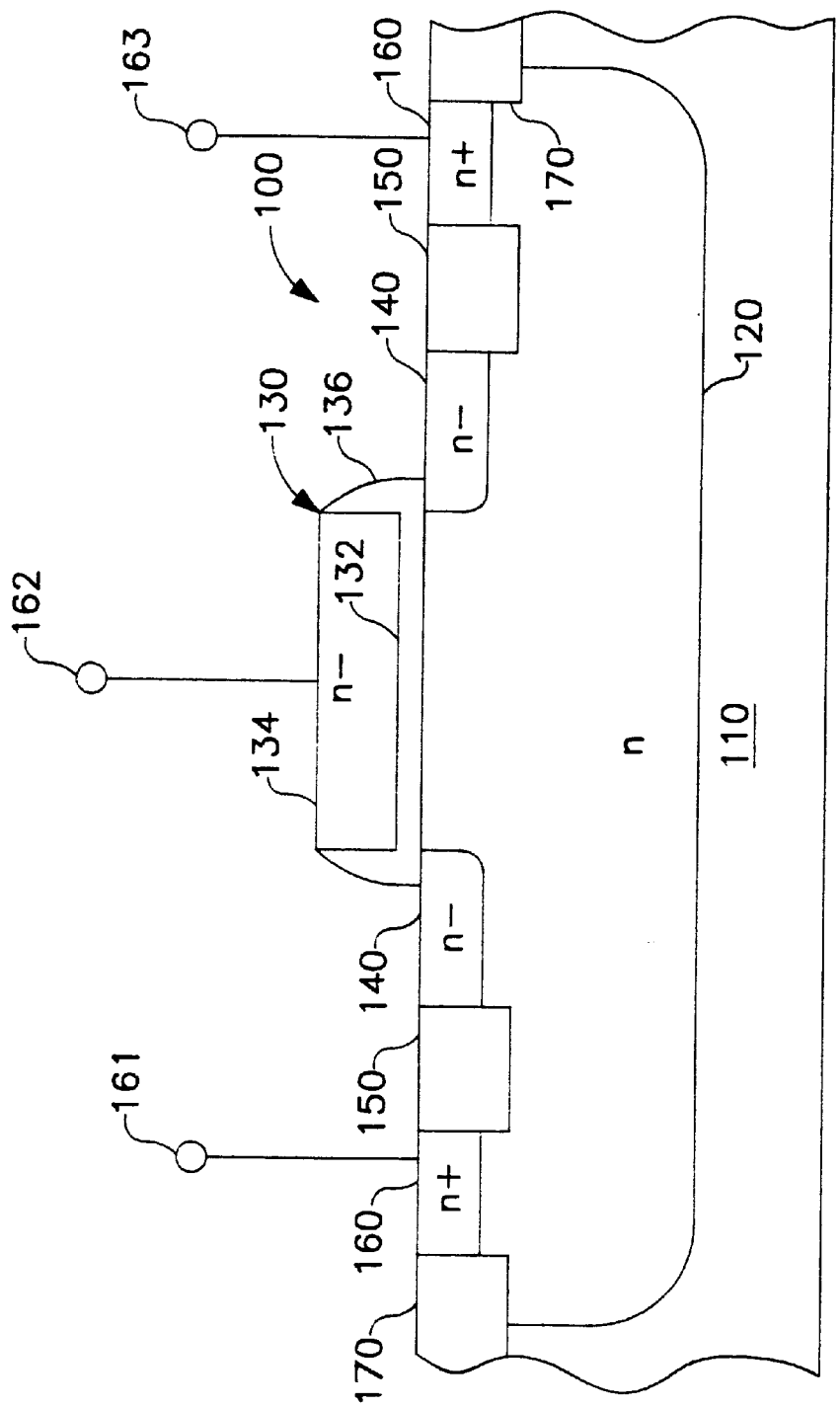
FIG. 1B is a cross-sectional view of the formed capacitor after the process of FIG. 1A.

According to one aspect of the present invention, a structure, fabrication method and circuit application for a capacitor element are provided. The capacitor element may be used for applications which require insensitivity to voltage stressing, and electrical overstress (EOS) and electrostatic discharge (ESD) phenomena. The capacitor element may be used for mixed voltage applications, analog/digital applications and mixed signal applications.

According to another aspect of the invention, a structure, fabrication method and circuit application for a resistor element are provided. The resistor element may be used for ESD protection, impedance matching, input/output (I/O) circuitry, resistors within ESD networks, or analog circuitry applications.

According to another aspect of the invention, a polysilicon gate structure is placed on at least one dielectric film. The polysilicon film electrically depletes, reducing the voltage stress across the dielectric film. This is achieved by the method of counter-doping or low doped implantation of the polysilicon gate structure, to form a capacitor structure, which may be a decoupling capacitor structure.

The polysilicon film depletes because the doping concentration is low. According to a further aspect of the present invention, the polysilicon depletion upon voltage biasing reduces voltage stress across the capacitor structure.

According to another aspect of the invention, a low doped polysilicon gate structure is placed on at least one dielectric film. The polysilicon film electrically depletes. The polysilicon gate structure dopant type is the same as that of the implant adjacent to the film and the same as the well or substrate forming a capacitor structure. The low-doped polysilicon gate structure is placed on a well which may be placed on a silicon-on-insulator (SOI) structure forming a capacitor structure for SOI applications. A low doped source/drain implant may be used to establish the polysilicon gate dopant concentration. A first electrode is coupled to the low doped polysilicon gate structure, and a second electrode is coupled to at least one of the implant (diffusion) regions adjacent to the polysilicon gate structure, to use the circuit element as a capacitor.

According to still another aspect of the invention, a low doped polysilicon gate structure is placed on at least one dielectric film. The method incorporates the use of a low doped MOSFET LDD or extension implant to establish the polysilicon gate dopant concentration. A gate region block mask is utilized to form low series resistance capacitor implants and to prevent over-doping of the gate structure.

According to an additional aspect of the invention, a low doped polysilicon gate structure is placed on at least one dielectric film. A hybrid resist is applied to increase the dopant concentration on the edge implants to reduce capacitor series resistance.

A low doped polysilicon gate variable capacitor element according to this invention has a capacitance which is a function of the applied voltage bias, wherein the polysilicon depletion C-V curve degradation is used for voltage stress reduction and circuit applications.

In the prior art capacitor devices known to the inventors, highly doped films were used to avoid depletion into the polysilicon film. The voltage across the dielectric was typically not a concern. It was believed that the use of low doped films would result in loss of the ability to use the capacitor to deplete the silicon side of the gate dielectric.

According to the present invention, the polysilicon side of the capacitor is depleted, in addition to the silicon side. Because the polysilicon film depletes, voltage drop across the insulator is reduced. Because the voltage drop across the insulator is reduced, a capacitor according to the invention can withstand higher voltages for those applications where higher voltages are desired.

According to the invention, when the depleted polysilicon capacitor is incorporated in a circuit including other elements (e.g., MOSFETs) for which control of the channel cannot be degraded, the low doped polysilicon is only used in the capacitor element, not in the MOSFET. In a fabrication method according to the invention, the same polysilicon film layer may be used for the gate dielectric of both the capacitor and the MOSFET, but different masks are used to perform different implant operations. This technique prevents depletion of the polysilicon gate structure of the MOSFET, maintaining control of the channel, at the same time that a low doped material is used in the gate of the capacitor element.

According to a further aspect of the invention, the above described semiconductor structure may further include a second dielectric film formed on the first polycrystalline silicon conductor, and a second polycrystalline silicon conductor formed on the second dielectric film, wherein one of the group consisting of the first and second polycrystalline silicon conductors has an impurity concentration substantially lower than a standard impurity concentration for the gate conductor of an MOS device.

According to a further aspect of the invention, the above described semiconductor structure may be used as a resistor element, by coupling a first electrode to a first one of the impurity diffusion regions adjacent the polysilicon gate structure, and a second electrode to a second one of the impurity diffusion regions on the opposite side of the polysilicon gate structure.

DETAILED DESCRIPTION

The present invention is embodied in a capacitor element, a circuit including the capacitive element, and a method of forming the capacitor element.

FIG. 1B is a cross-sectional view of a first exemplary embodiment of the invention, referred to as a "depleted polysilicon capacitor." Capacitor element 100 includes a semiconductor substrate 110.

A well region 120 of a first conductivity type is formed in a surface of the substrate 110. The first conductivity type may be opposite the conductivity type of the substrate. In FIG. 1B, the well region 120 is an n-well. The well region 120 has a doping implant dose which may be in the range of $5 \times 10^{12}/cm^2$ to $1 \times 10^{14}/cm^2$. The typical implant concentration for n-well structures are $1 \times 10^{16}/cm^3$ to $1 \times 10^{18}/cm^3$. Note that, in the example, the substrate 110 is a P-doped substrate, i.e., a second conductivity type opposite the first conductivity type.

A polycrystalline silicon film 130 is formed on the surface of the substrate 110, above the well region 120 of the substrate 110. A gate conductor 134 of the first conductivity type (in the example, n-type) is formed in the surface of the polycrystalline silicon film 130. The n-gate conductor 134 has an impurity concentration lower than the standard MOSFET gate conductor concentrations. The n-gate conductor 134 doping concentration is a doping implant dose less than $3 \times 10^{15}/cm^2$ for a concentration less than $1 \times 10^{20}/cm^3$. A gate structure 130 is formed on the well region. The gate structure 130 includes the polycrystalline silicon film 134 and the gate insulator film 132 (a dielectric film). A polycrystalline silicon edge spacer 136 is formed on each side of the gate conductor 134.

In other words, referring to FIG. 1B, the apparatus comprises a substrate 110 where an n-well 120 is disposed therein. A low doped n-type conductor 134 is formed over the n-well 120. A dielectric film 132 (gate insular) is formed between the n-well 120 and the conductor 134. The apparatus includes contacts 136 coupled to the n-well 120 and the conductor 134 which form a capacitor where the n-well 120 and the conductor 134 are plates of the capacitor.

A first pair of first conductivity type (n−) impurity diffusion regions 140 is formed adjacent to the polycrystalline silicon edge spacers 136. The polycrystalline silicon film 134 and edge spacers 136 lie on a portion of the substrate 110 between the first pair of first conductivity type impurity diffusion regions 140.

The first pair of first conductivity (n−) type impurity diffusion regions 140 are n− diffusion regions, and are doped with an impurity concentration lower than the impurity concentration of the well region 120. The gate conductor 134 and the first pair of first conductivity type impurity diffusion regions 140 may be formed by a single implantation step.

A second pair of first conductivity type (n+) impurity diffusion regions 160 is formed in a surface of the substrate 110. The first pair of first conductivity type impurity diffusion regions 140 are located between the second pair of first conductivity type impurity diffusion regions 160. The exemplary second pair of first conductivity type impurity diffusion regions 160 are n+ type, and have an impurity concentration higher than the standard impurity concentration for the gate conductor of an MOS device. The n+ source/drain doping concentration is a doping implant dose greater than $3\times10^{15}/cm^2$ for a concentration greater than $1\times10^{20}/cm^3$.

A respective isolation region 150 is provided on each side of the polycrystalline silicon film 130. Each isolation region 150 lies between one of the first pair of first conductivity type impurity diffusion regions 140 and one of the second pair of first conductivity type impurity diffusion regions 160. An isolation region 170 lies on the outside edges of the n-well 120, with the n+ diffusion regions 160 in between.

A decoupling capacitor as shown in FIG. 1B is tolerant of overvoltage conditions. By lightly doping the polysilicon gate conductor 134, when a voltage is applied, the electric field penetrates into the silicon substrate 110, the dielectric gate insulator film 132, and the polycrystalline silicon film 134. In a decoupling capacitor structure, the gate, source and drain diffusion regions are placed into a well 120 of the same dopant type (n-type). The polysilicon gate conductor 134 is deposited as an intrinsic polysilicon. The gate is then implanted so that the dopant concentration is below that of the standard source/drain implant impurity concentration.

The advantage of the depleted capacitor structure according to the invention is that the electric field across the gate insulator film 132 is lower, thereby avoiding overvoltage during either electrostatic discharge (ESD) or functional operation.

A method for forming a capacitor element of FIG. 1B, comprises the following steps:

A semiconductor substrate 110 is provided. An isolation region 170 is formed on the substrate. A well region 120 of a first conductivity type is formed in a surface of the semiconductor substrate 110. The well region 120 has an impurity concentration. A gate insulator film 132 is formed on the well region 120. A polycrystalline silicon film 134 is formed on the gate insulator film 132. Impurities of the first conductivity type (n−) are implanted into the polycrystalline silicon film 134 at a concentration lower than the standard impurity concentration for the gate conductor of an MOS device.

A first pair of first conductivity type (n−) impurity diffusion regions 140 is formed, having an impurity concentration lower than the standard impurity concentration for the gate conductor of an MOS device. The gate structure 130 (including the polycrystalline silicon film 134 and the gate insulator film 132) is formed over the well region 120, on a portion of the substrate 110 between the first pair of first conductivity type impurity diffusion regions 140.

FIG. 1A shows a photoresist mask 131 applied to cover the polycrystalline silicon film 134 and the n− implant impurity diffusion regions 140. Once the photoresist mask 131 is applied, an n+ implant operation is performed. A second pair of first conductivity type (n+) impurity diffusion regions 160 is formed having an impurity concentration higher than the standard impurity concentration of a source/drain diffusion region. The n− diffusion regions 140 are located between the n+ diffusion regions 160. The other steps used in forming the device of FIG. 1B are similar to the steps described in detail below with reference to FIGS. 2B to 2V.

Polysilicon depletion provides a more voltage tolerant structure than the structures of the prior art, and reduces the series resistance of the device.

Three electrodes 161–163 are schematically shown connected to the second pair of first conductivity type (n+) impurity diffusion regions 160 and the polycrystalline silicon film 134. According to one aspect of the invention, electrodes 161 and 163 may be electrically connected to each other, to form a capacitor element between electrode 162 and the connected electrodes 161 and 163. Alternatively, either of the electrodes 161 or 163 may be omitted (or unused), and a capacitor element is formed between electrode 162 and one of the group consisting of electrodes 161 and 163.

Alternatively, electrode 162 may be omitted (or unused), and a resistor element is formed between electrodes 161 and 163.

Figure 1D:
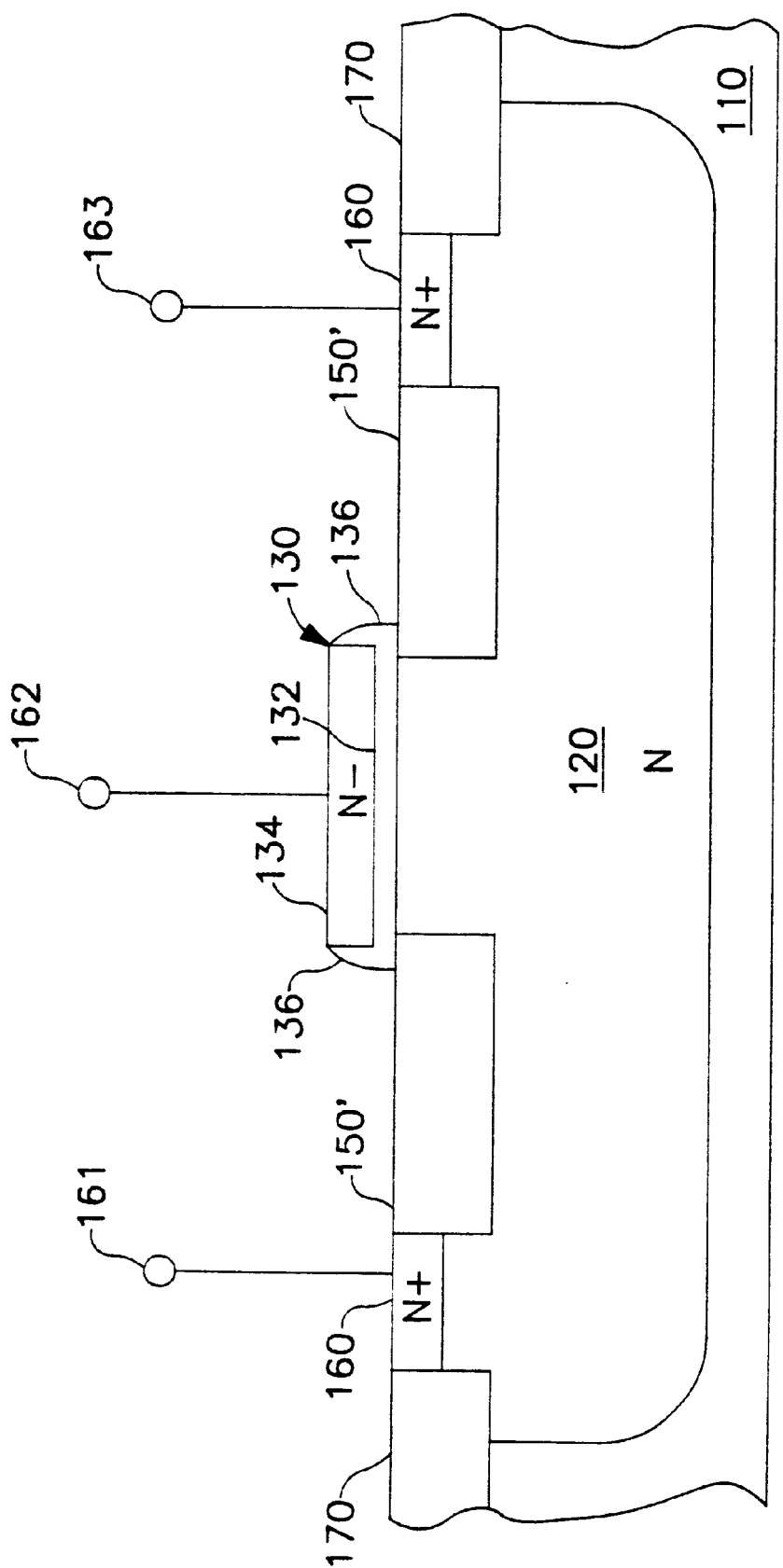
FIG. 1D is a cross-sectional view of the formed capacitor after the process of FIG. 1C.

FIG. 1D is a cross-sectional view of a variation of the first exemplary depleted polysilicon capacitor shown in FIG. 1B. Elements in FIG. 1D that are the same as elements in FIG. 1B have the same reference numeral, and descriptions of these items are not repeated below. In the device of FIG. 1D, the shallow trench insulator 150' extends all of the way to the polycrystalline gate conductor 134, and there is no region corresponding to diffusion region 140 of FIG. 1B. Instead of having an n− diffusion next to the gate conductor 134 (as in FIG. 1B), the embodiment of FIG. 1D extends the STI region 150' towards the gate conductor 134, so the gate conductor 134 overlaps the STI region 150'. The embodiment of FIG. 1D provides a bigger resistance, which is a function of the relative resistance of n− diffusion region 140 (FIG. 1B) versus the resistance of the n-well 120 (FIG. 1D).

As described above with reference to FIG. 1B, electrodes 161 and 163 may be electrically connected to each other, to form a capacitor element between electrode 162 and the connected electrodes 161 and 163. Alternatively, either of the electrodes 161 or 163 may be omitted (or unused), and a capacitor element is formed between electrode 162 and one of the group consisting of electrodes 161 and 163.

Alternatively, electrode 162 may be omitted (or unused), and a resistor element is formed between electrodes 161 and 163.

FIG. 1C shows a photoresist mask 131' applied to cover the polycrystalline silicon film 134 and the STI region 150'. Once the photoresist mask 131' is applied, an n+ implant operation is performed. A pair of first conductivity type (n+)

impurity diffusion regions 160 is formed having an impurity concentration higher than the standard impurity concentration of a source/drain diffusion region. The STI regions 150 are located between the n+ diffusion regions 160. The other steps used in forming the device of FIG. 1D are similar to the steps described in detail below with reference to FIGS. 23 to 2V.

Figure 2A:
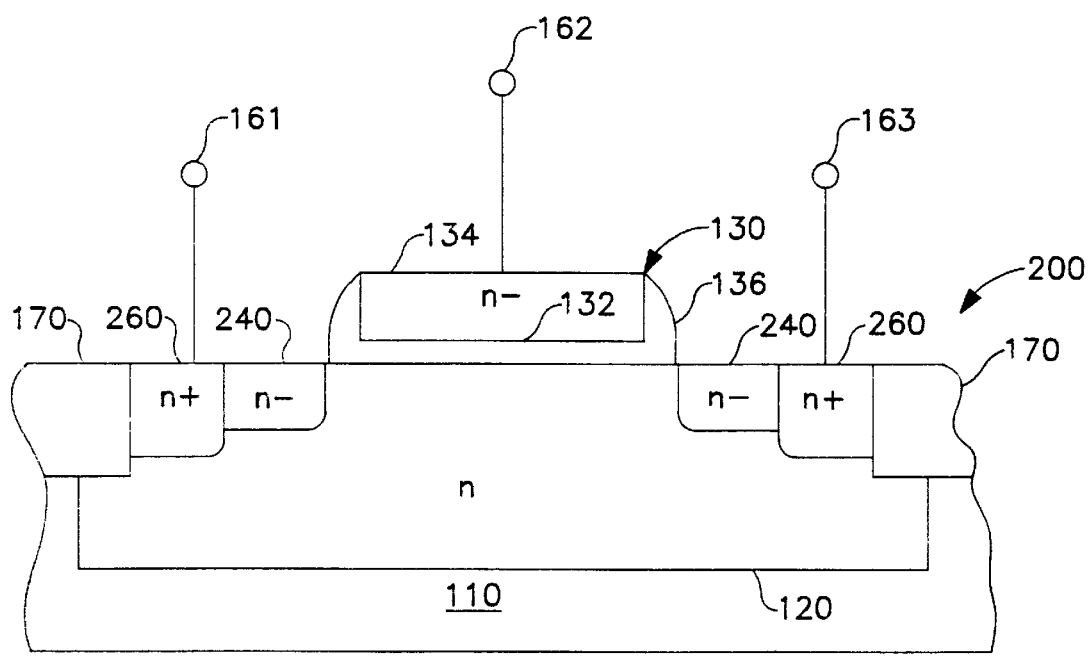
FIG. 2A is cross-sectional view of a second exemplary depleted polysilicon capacitor according to the invention, with n-type implants.

FIG. 2A shows a further exemplary embodiment of the invention. Several elements of the capacitor 200 are the same as in FIG. 1B, and are identified by the same reference numerals as in FIG. 1B. Only the items that differ from the items in FIG. 1B (and have different reference numerals) are described below.

In FIG. 2A, the second pair of first conductivity type impurity diffusion regions 260 are source and drain regions. Each of the source and drain regions 260 is adjacent to a respective one of the first pair of first conductivity type impurity diffusion regions 240. The resulting structure features integration of the n-channel MOSFET source/drain diffusion regions 260 with the low doped implant diffusion regions 240. In this case, the doping concentration of the source/drain is connected to a low resistance shunt to the gate edge. The device of FIG. 2A is similar to a lightly-doped drain (LDD) MOSFET.

In FIG. 2A, the normal source/drain implant 260 abuts the low doped n− implants 240. There is no isolation region between the n− and the n+ diffusion regions. The capacitor 200 of FIG. 2A resembles a lightly-doped drain (LDD) MOSFET, or a MOSFET with extension implants. The electrical difference between the structures in FIGS. 1B and 2A is the contact resistance in series with the capacitor structure. The structure of FIG. 1B has the isolation region 150 between the n− diffusion region 140 and the n+ diffusion region 160, providing greater resistance.

This difference is best understood by considering the devices of FIGS. 1B and 2A to each include a capacitor in series with a resistor. Contacts are coupled to the n+ diffusion regions 160 or 260 on the two far sides of the polycrystalline silicon film. In FIG. 1B, there is an isolation region 150 between the gate conductor 134 and the n+ diffusion region 160, so the series resistance of the device is essentially limited by the sheet resistance of well 120. The structure of FIG. 2A has the n− diffusion region 240 abutting the n+ diffusion region 260, with no isolation region in between. The contacts would then be on the n+ diffusion region 260, and the series resistance between the n+ diffusion region 260 and the capacitor at least near the surface includes some of the surface resistance of the n-well region 120 in series with the n− diffusion region 240, but there is no intervening isolation. Consequently, the device of FIG. 2A has a lower resistance.

From a footprint perspective, the device of FIG. 2A may also be made smaller. It is physically smaller because there is no isolation width between n− diffusion region 240 and n+ diffusion region 260.

On the other hand, if it is desirable to eliminate a source of electrons near the edge of the gate conductor 134 due to n+ diffusion regions (for example, to avoid high voltages at the gate corners), then the configuration of FIG. 1B may be preferable. The device of FIG. 1B isolates the n+ diffusion region 160 from the gate conductor 134. The configuration of FIG. 1B may also be advantageous if a larger resistance is desired. For example, a depleted polysilicon capacitor may be used in an RC filter, i.e., integrating a well resistor in series with a capacitor. When the device is used in an RC network, the series resistance is the resistance from the n+ diffusion 160 to about the center of the gate conductor 134. The structure of FIG. 1B inherently builds a resistor and n-well resistor in series with the capacitor. This may be useful, for example, to provide a certain desired frequency response, i.e., RC time constant. In contrast, the device of FIG. 2A operates like a high performance capacitor with a low series resistance.

As described above with reference to FIG. 1B, electrodes 161 and 163 may be electrically connected to each other, to form a capacitor element between electrode 162 and the connected electrodes 161 and 163. Alternatively, either of the electrodes 161 or 163 may be omitted (or unused), and a capacitor element is formed between electrode 162 and one of the group consisting of electrodes 161 and 163. Alternatively, electrode 162 may be omitted (or unused), and a resistor element is formed between electrodes 161 and 163.

Figure 2B:
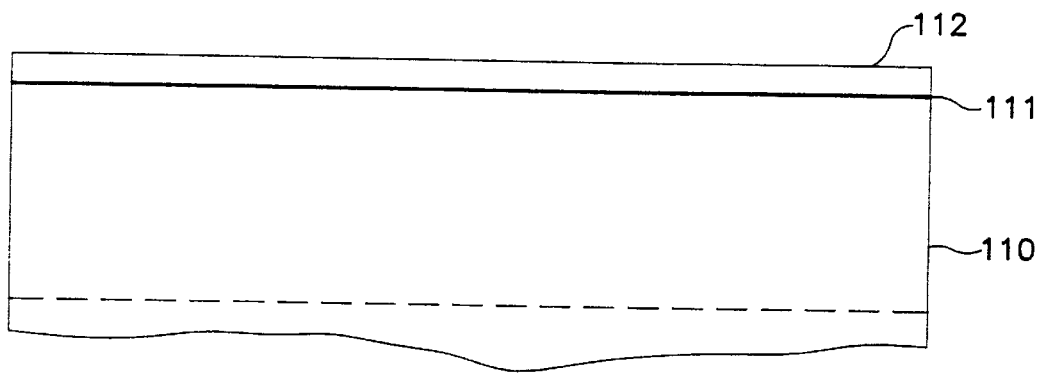
FIGS. 2B to 2V show in detail the steps of fabricating the capacitor of FIG. 2A using either a p-type or an n-type implant.
Figure 2C:
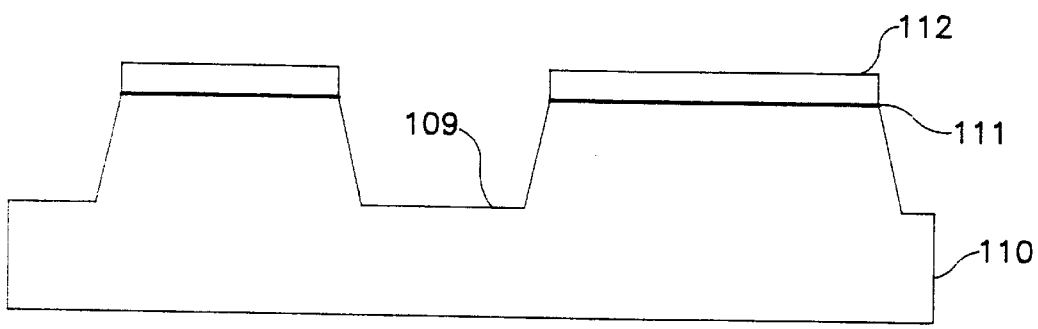
Figure 2D:
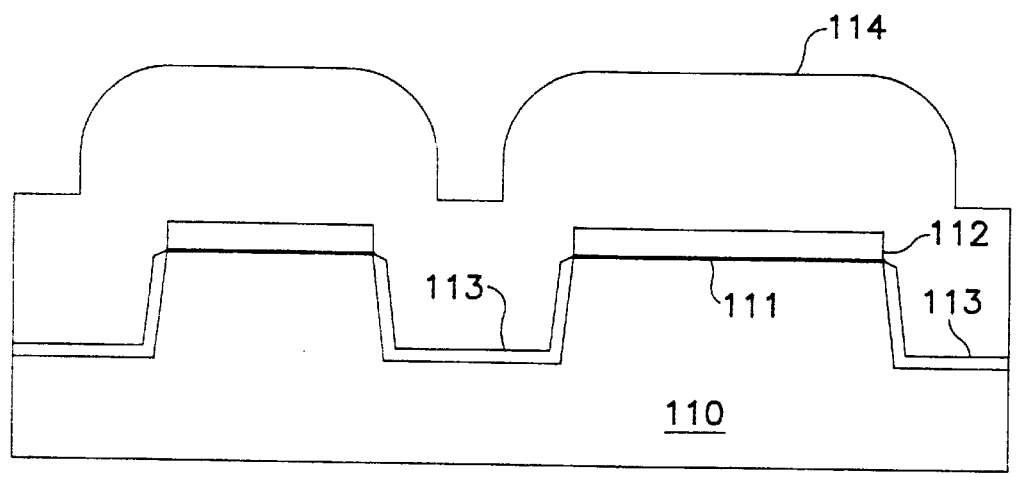
Figure 2E:
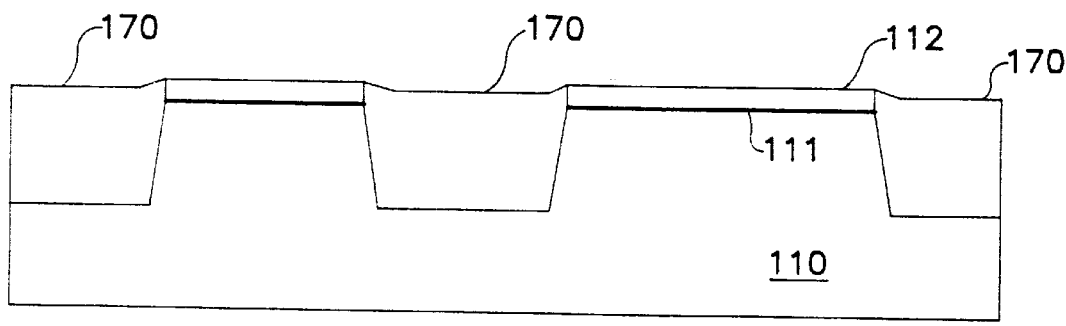
Figure 2F:
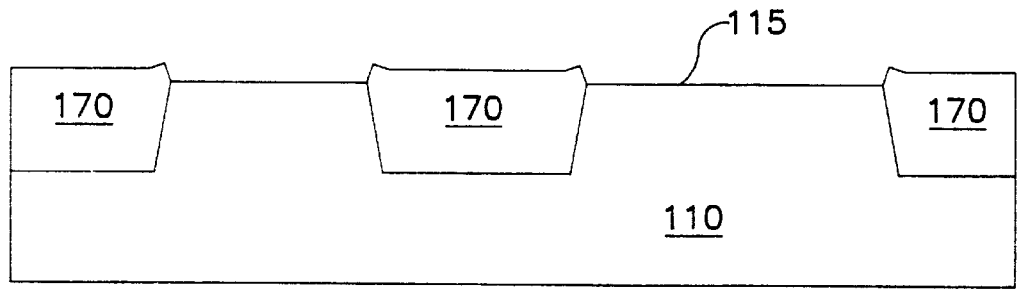
Figure 2G:
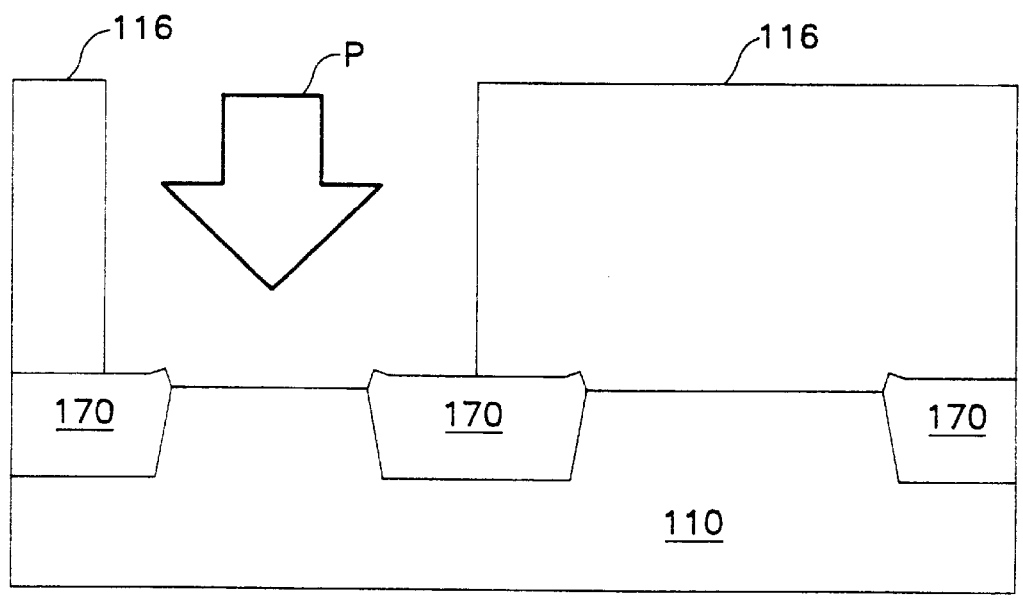
Figure 2H:
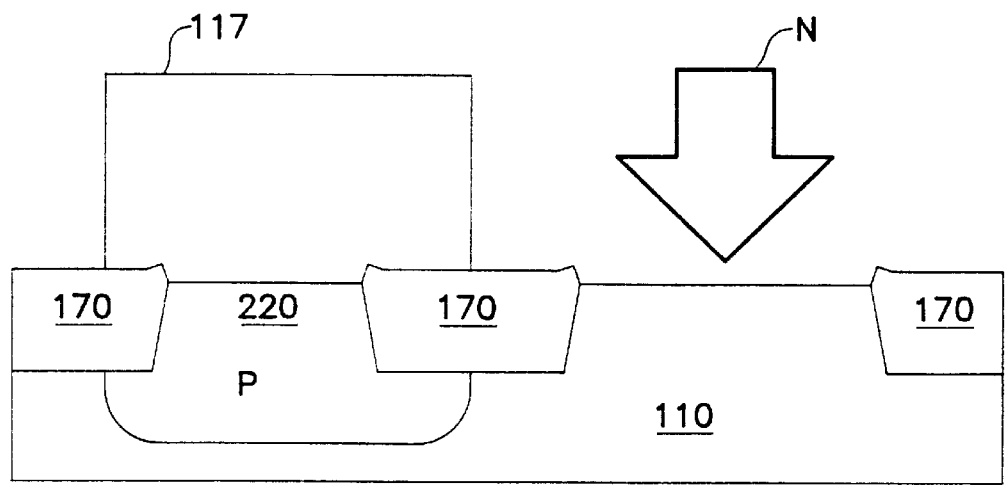
Figure 2I:
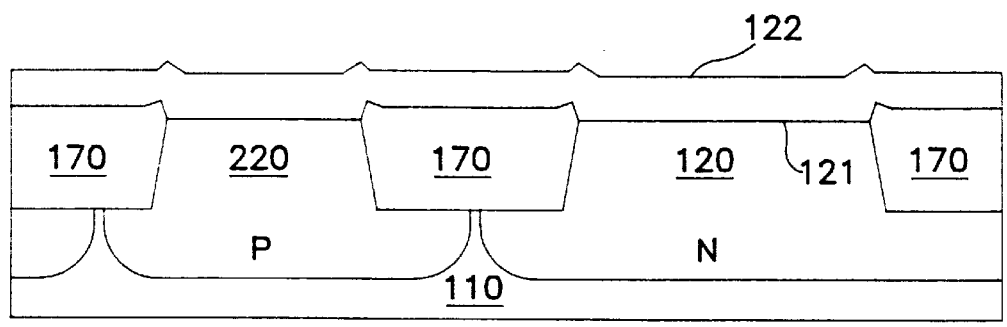
Figure 2J:
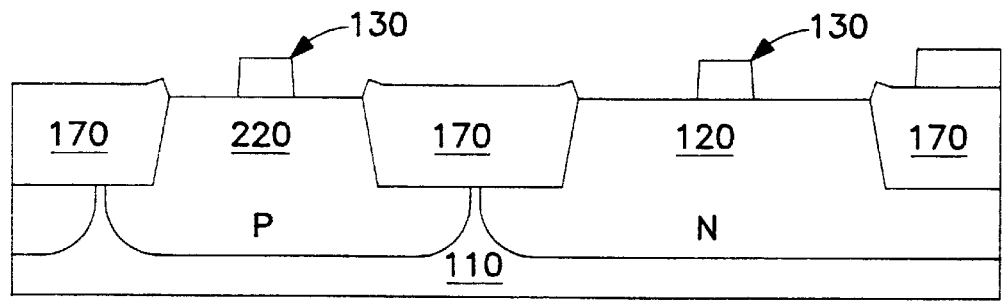
Figure 2K:
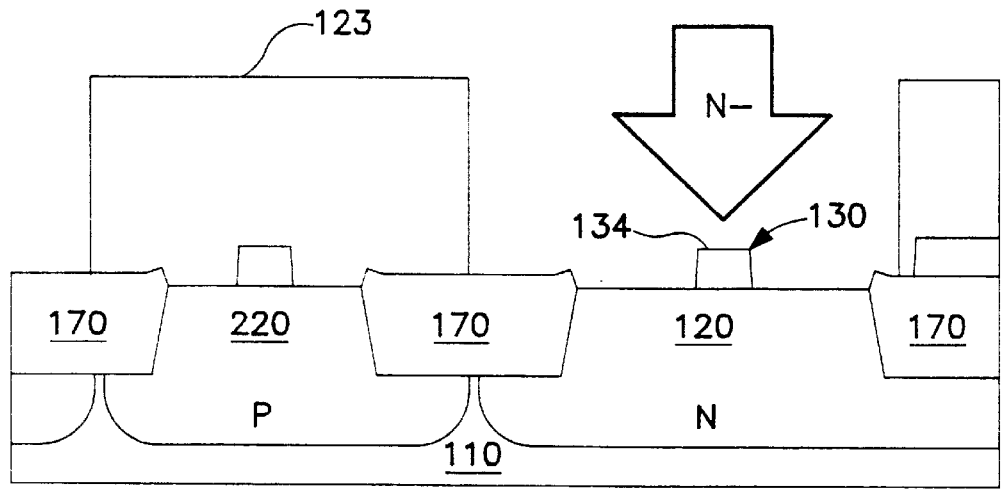
Figure 2L:
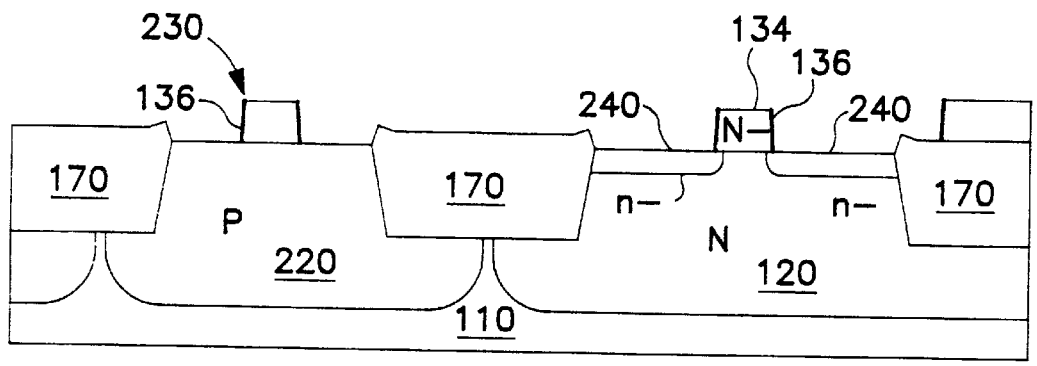
Figure 2M:
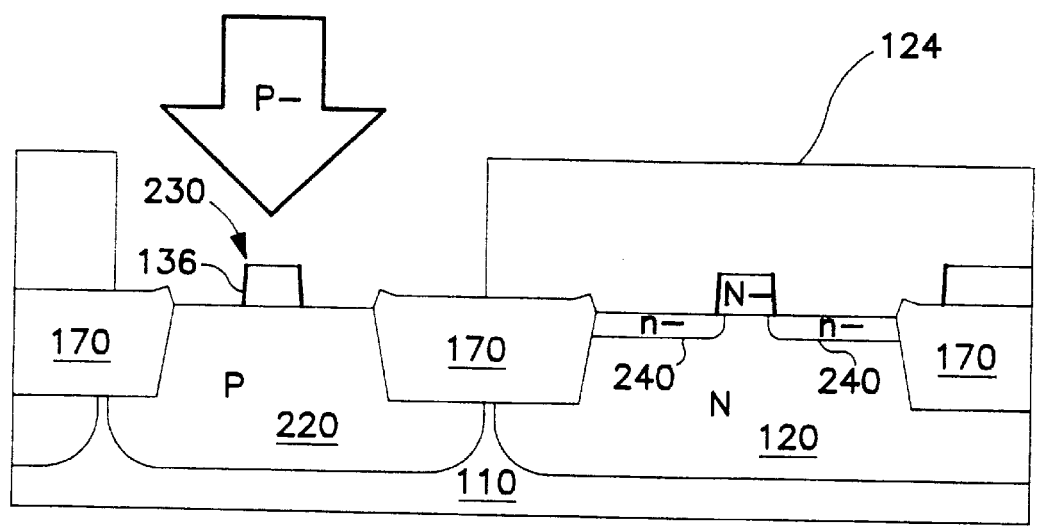
Figure 2N:
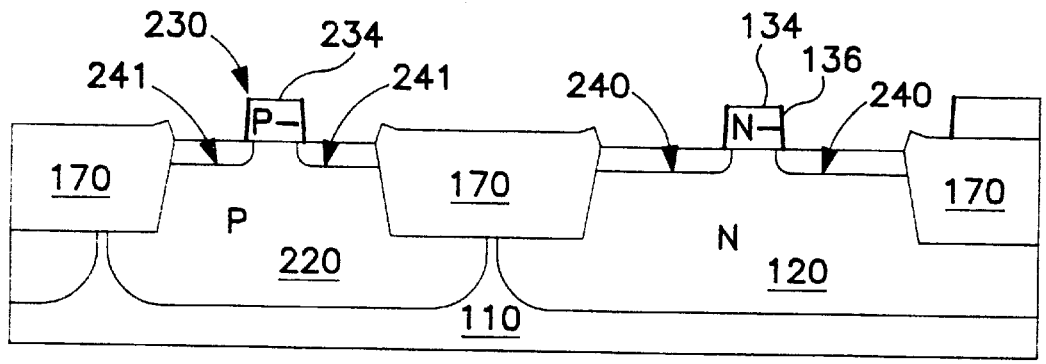
Figure 2O:
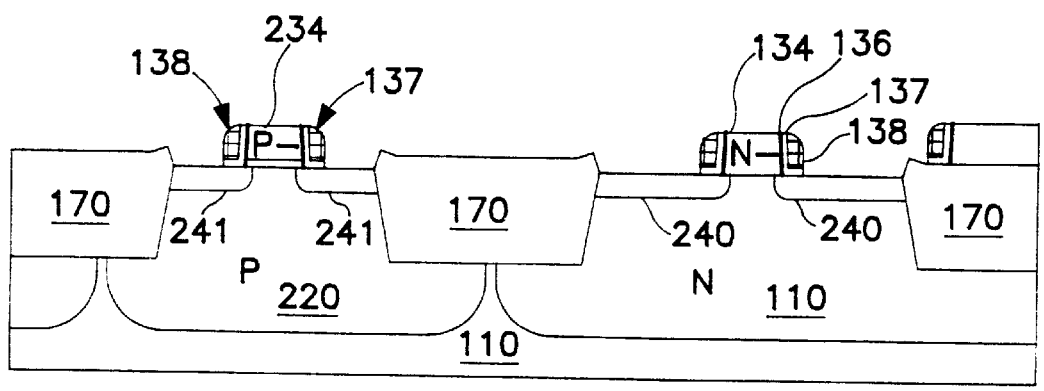
Figure 2P:
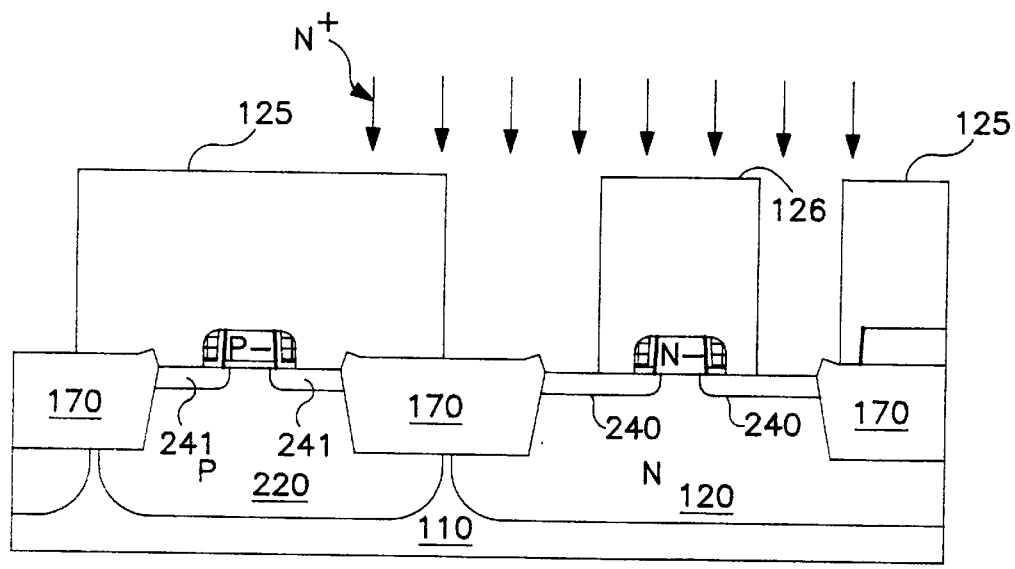
Figure 2Q:
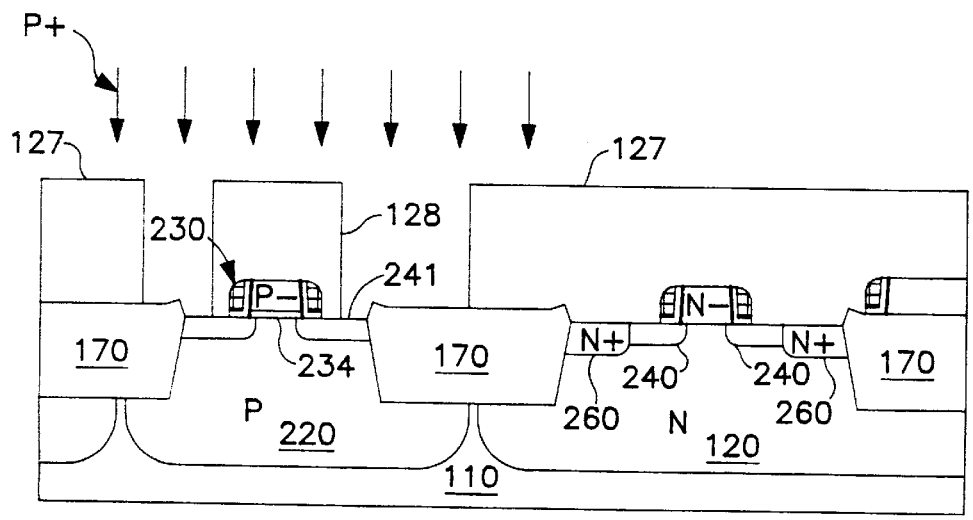
Figure 2R:
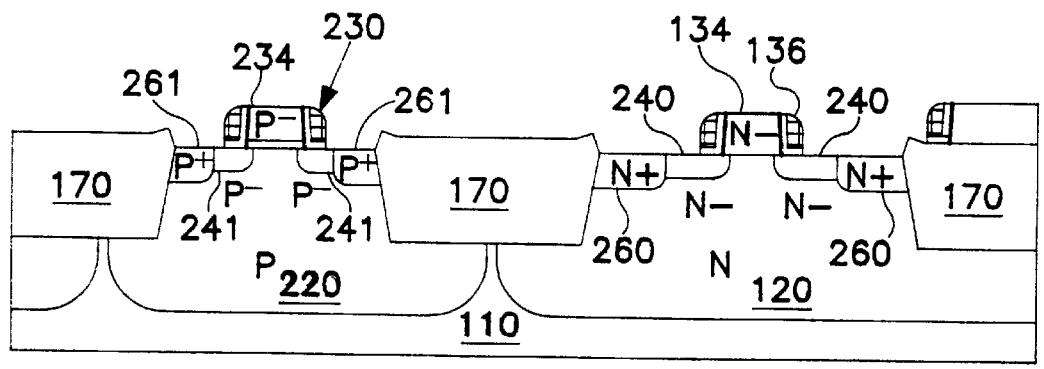
Figure 2S:
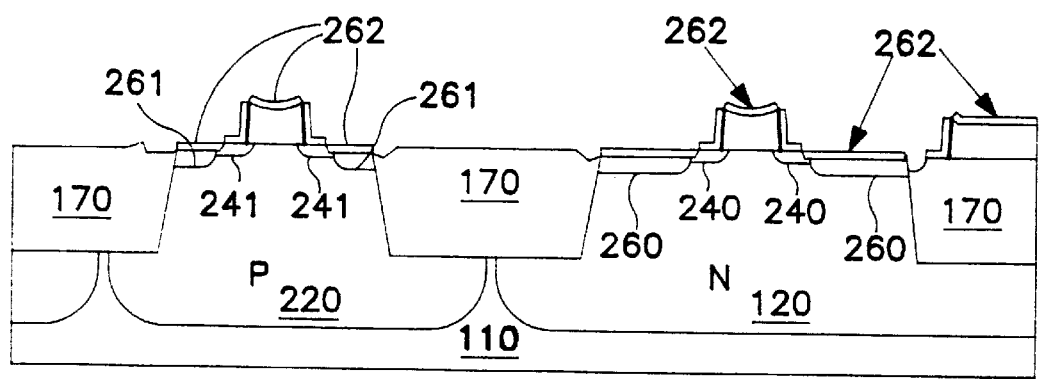
Figure 2T:
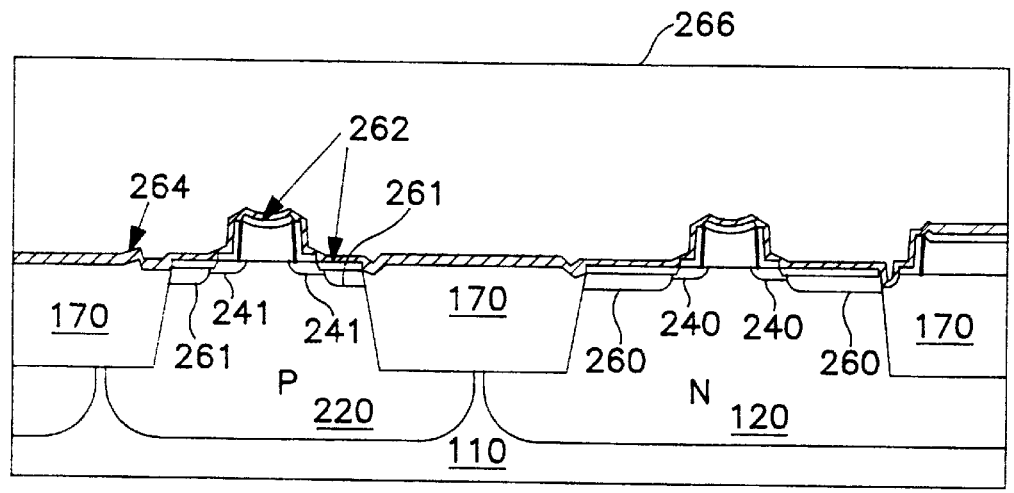
Figure 2U:
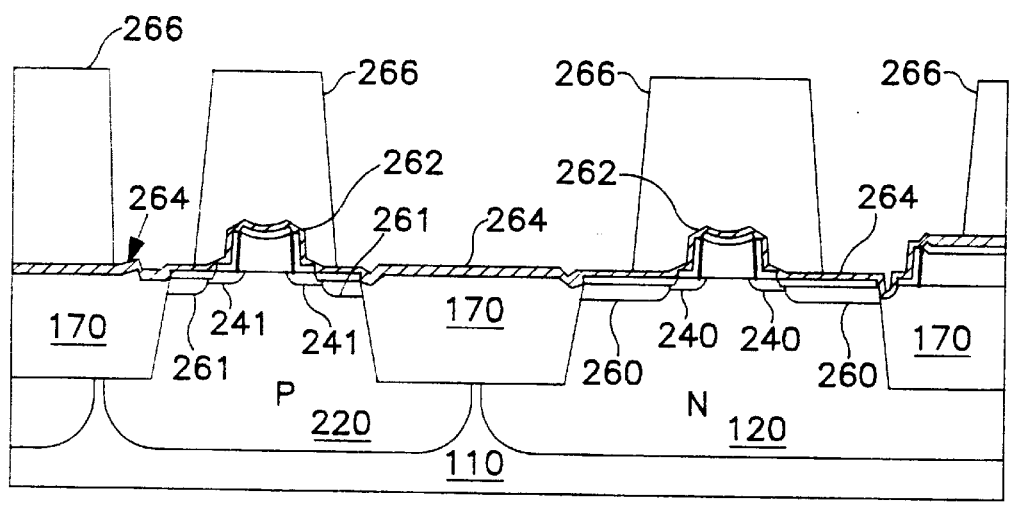
Figure 2V:
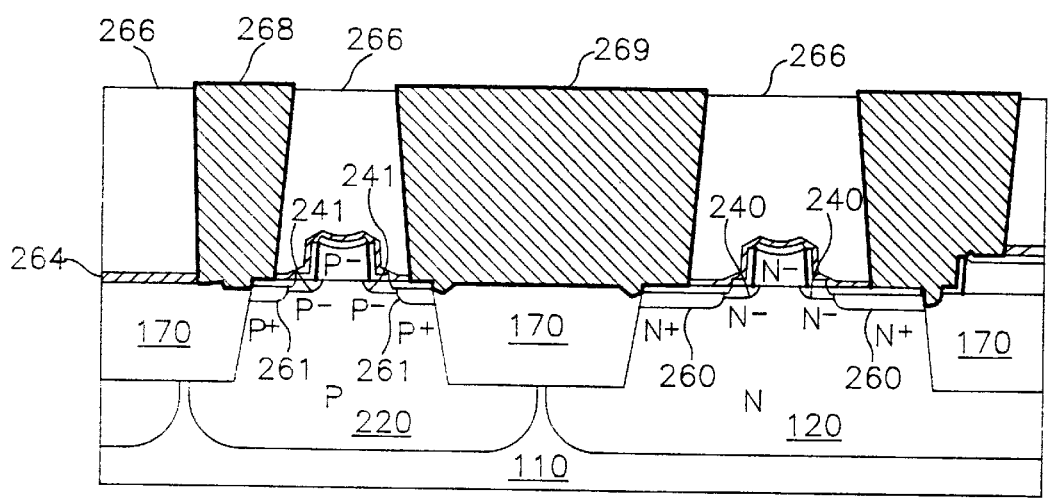

FIGS. 2B through 2V show a method for fabricating n and p type devices as shown in FIG. 2A. One of ordinary skill in the art understands that the n and p type devices are shown juxtaposed in FIGS. 2B through 2V for the purpose of efficiently showing the process steps for both types of devices. One of ordinary skill in the art recognizes that it is not necessary to form a p type device and an n type device next to one another as shown; either type of device may be used without the other.

FIG. 2B shows a wafer 110, on which a pad nitride layer 112 is formed on top of a pad oxide layer 111. The wafer 110 a 2 μm p-epi on p+ substrate.

FIG. 2C shows a process step in which a trench 109 is etched in the wafer 110.

FIG. 2D shows a process step in which a shallow trench liner oxide 113 is formed. Then, a low pressure chemical vapor deposition (LPCVD) tetra-ether oxide silane (TEOS) fill 114 is applied above the pad nitride layer 112.

FIG. 2E shows a process step in which a polishing operation is performed, to polish the TEOS fill 114 down to the level of the pad nitride layer 112, to form the STI 170.

FIG. 2F shows a process step in which the pad nitride layer 112 is removed and a screen oxide 115 is applied. The screen oxide 115 is for defects.

FIG. 2G shows a process step in which a conventional photoresist 116 is applied to cover the site for the n type device, using a conventional photolithography technique, and the site of the p type device is cleared of any photoresist. The p type dopant is applied to form the p-well region 220 (shown in FIG. 2H). A typical p-well implant, such as boron, may be used. Photoresist 116 is then removed.

FIG. 2H shows a process step in which a second photoresist 117 is applied to cover the p-well region 220, using a conventional photolithography technique. The n type dopant, which may be phosphorus or arsenic, is applied to form n-well 120. Second photoresist 117 is then removed.

FIG. 2I shows a process step in which the screen oxide 115 is removed, for example, by etching. A gate oxide 121 is applied. Then a layer of polysilicon 122 is applied.

FIG. 2J shows a process step in which a conventional etching process is used to remove the polysilicon layer 122 except in the areas where the gate conductors 134 are to be formed. A conventional etching process may be used.

FIG. 2K shows a process step in which a photoresist 123 is applied over the site where the p type device is to be formed. The NFET extension implant (a lightly doped drain implant) is performed to form gate conductor 134 and n− diffusion regions 240 (shown in FIG. 2L).

FIG. 2L shows a process step in which the NFET extension photoresist 123 (shown in FIG. 2K) is removed. At this point in the process, the n– diffusion regions 240 extend from the polycrystalline silicon gate conductor 134 to the STI region 170. The nitride edge spacers 136 are formed on the sides of gate conductor 134.

FIG. 2M shows a process step in which a photoresist 124 is applied over the site where the n type device is to be formed. The PFET extension implant (a lightly doped drain implant) is performed to form a p– gate conductor 234 and p– diffusion regions 241 (shown in FIG. 2N).

FIG. 2N shows a process step in which the PFET extension photoresist 124 (shown in FIG. 2M) is removed. At this point in the process, the p– diffusion regions 241 extend from the gate conductor 234 to the STI region 170.

FIG. 2O shows a process step in which the spacer films 137 and 138 are formed. A source-drain spacer nitride is formed on the nitride edge spacer 136. Then a source-drain spacer oxide film 138 is deposited on the spacer nitride film 137.

FIG. 2P shows a process step in which photoresist 125 is applied to cover the entire p type device. Photoresist 126 (which is preferably applied in a single layer at the same time as photoresist 125) is applied to cover a portion of the n type device which includes the gate conductor 134 and the portion of each diffusion region 240 proximate to the gate conductor. Then the N+ source/drain implant is made to form n+ source/drain diffusion regions 260 (shown in FIG. 2Q). The n dopant used in this step may be phosphorus or arsenic. The portion of the n– diffusion regions 240 covered by the photoresist 126 determines the length of the n– diffusion regions 240 in the completed device. Thus, one of ordinary skill in the art recognizes that the wider photoresist 126 is, the greater the resistance of the final device. The photoresist 125 and the photoresist 126 are removed.

FIG. 2Q shows a process step in which photoresist 127 is applied to cover the entire n type device. Photoresist 128 (which is preferably applied in a single layer at the same time as photoresist 127) is applied to cover a portion of the p type device which includes the gate conductor 234 and the portion of each p– diffusion region 241 proximate to the gate conductor 234. Then the p+ source/drain implant is made to form p+ source/drain diffusion regions 261 (shown in FIG. 2R). The p dopant used in this step may be may be boron. The portion of the p– diffusion regions 241 covered by the photoresist 128 determines the length of the p– diffusion regions 241 in the completed device. Thus, the wider photoresist 128 is, the greater the resistance of the final device.

FIG. 2R shows the devices after the photoresist 127 and 128 is removed.

FIG. 2S shows a process step in which a self aligning silicide (salicide) layer 262, which may be, for example, titanium silicide, is deposited on the gate conductors 134 and 234, and on the source/drain diffusion regions 260 and 261. One of ordinary skill recognizes that the salicide 262 may be any kind of silicide material. It may, for example, be titanium, tungsten, cobalt, or any other silicide.

FIG. 2T shows a process step in which a silicon nitride etch stop layer 264 is applied. Then a planarized film 266, which may be BPSG or 6% PSG, is applied as the back end film.

FIG. 2U shows a process step in which contact holes are etched in the planarized film 266.

FIG. 2V shows a process step in which a tungsten film 268 is deposited. A conventional series of back end of line polishing steps is performed. A tungsten deposition is performed to form the studs 268. Then a polishing operation is performed. Then another tungsten film is applied and another polishing operation is performed. (Alternatively, aluminum may be used instead of tungsten.) MC stud 269 is a local interconnect. The fabrication process is completed.

FIG. 3 shows a circuit which integrates the n-channel MOSFET source/drain implant with the low doped implant and an n-channel MOSFET electronic switch. Elements in FIG. 3 that are the same as elements in FIG. 1B have the same reference numeral, and descriptions of these items are not repeated below. A capacitor element 300 similar to capacitor 200 is provided. A resistor 362 is formed on the substrate 110 and is connected to the capacitor element 300. A MOSFET 330 is formed on the substrate 110. MOSFET 330 has a gate input 334 that is connected to the resistor 362 and the capacitor element 300. MOSFET 330 includes a gate dielectric 332, n+ diffusion region 363 and STI 370. One of ordinary skill in the art could readily construct a high voltage version of the MOSFET (not shown), using the same depleted implant in the MOSFET.

The device shown in FIG. 3 acts like a capacitor with a low series resistance in series with a MOSFET. This may be useful where a low impedance in series with the capacitive structure is desired. This is an integration of the drain of the MOSFET with the low resistance path of the capacitor structure.

Figures 5A, 5B:
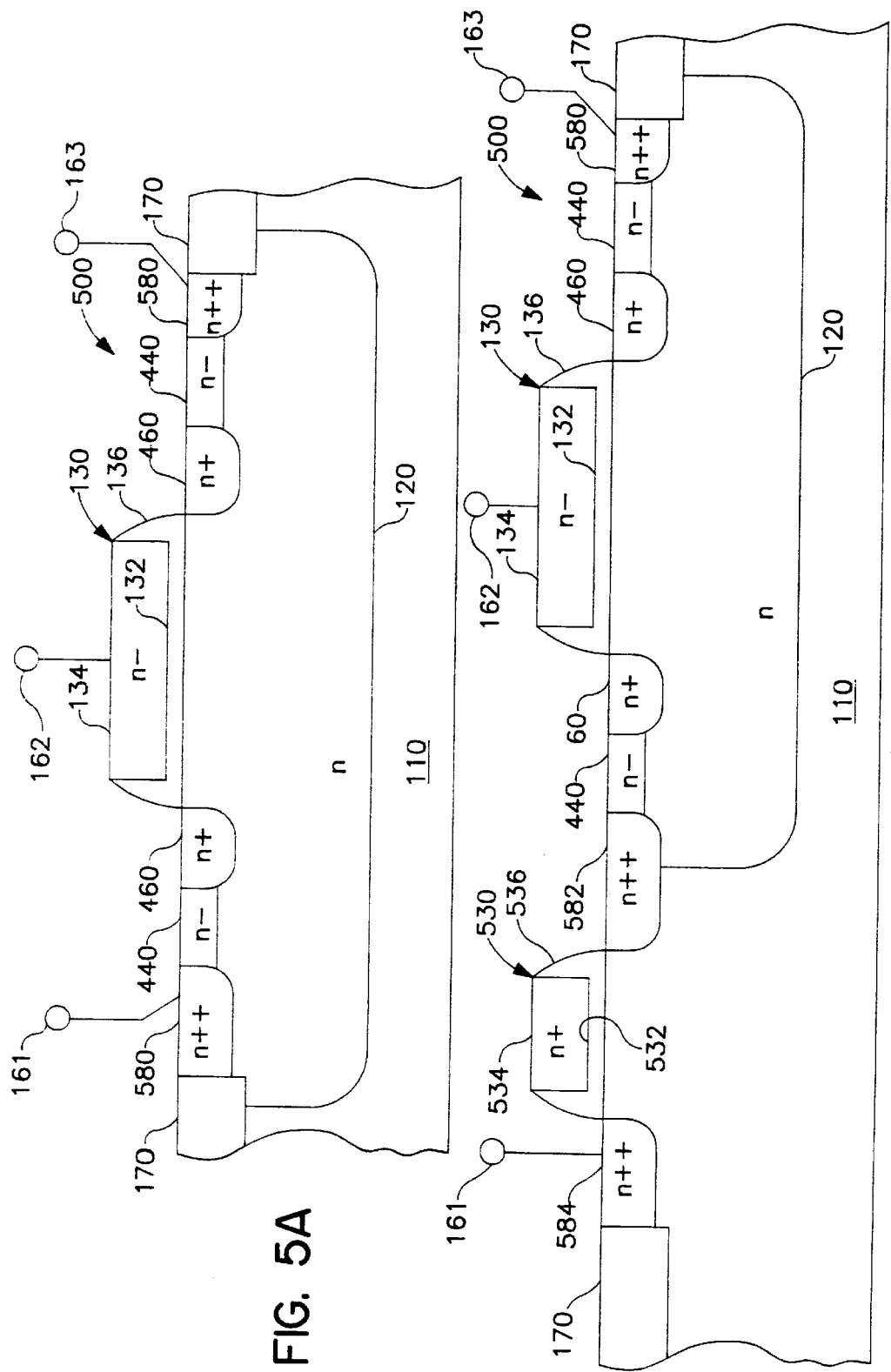
FIG. 5A shows a second depleted polysilicon capacitive element formed using a hybrid resist edge implant.
FIG. 5B shows a circuit including a MOSFET switch and a capacitive element as shown in FIG. 5A.
Figure 6:
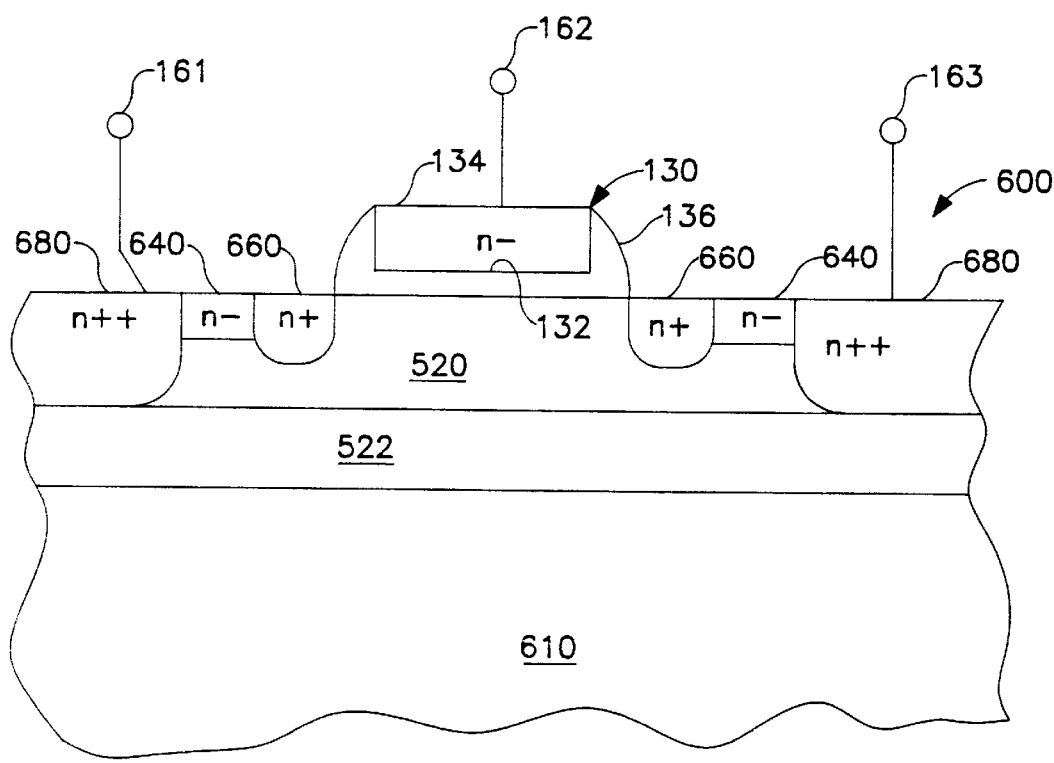
FIG. 6 shows a depleted polysilicon capacitor structure formed on a silicon on insulator (SOI) structure.

FIGS. 4–6 show further exemplary embodiments of the invention formed by a different process. The embodiments of FIGS. 4–6 deal with the following design issue.

As described above, the depleted polysilicon capacitor according to the invention provides an advantageous capacitor. In the devices of FIGS. 1B and 2A, however, the resistance along the length of the n– diffusion region 140 or 240 acts as a resistor itself. Diffusion regions 140 and 240 are thin, so their effective cross-sections as resistors is small. The doping concentration is low. So there is a series resistance penalty to having the n– diffusion region 140 or 240 between the gate and the electrodes. And the length of the n– diffusion region 140 or 240 is its effective series resistance up to the n+ diffusion region 160 or 260. So if the n+ diffusion region 160 or 260 is highly doped, and the n– diffusion region 140 or 240 is not, and the well region 120 is highly doped, the effective series resistance of the device from the capacitor back to the n+ diffusion region 160 or 260 is the length of the region between the edge of gate conductor 134 and the location where the n– diffusion 140 or 240 touches the n+ diffusion region 160 or 260.

Using a hybrid resist the edges of the gate can be locally treated with a high doped implant, to effectively decrease the resistance of that region and reduce the series resistance even further. A device as shown in FIG. 4 has a lower series resistance than that of FIGS. 1B or 2A. The hybrid resist implant is advantageous because the diffusion regions are self-aligned to the gate edge. The hybrid resist method doesn't affect the doping concentration of the gate region though it allows placement of a heavily doped implant on the edge of the capacitor, thus decreasing the effective series resistance of the n– diffusion region.

Thus, putting low-doped diffusion regions 140 on the side of the gate conductor 134 (As shown in FIG. 1B) increases the series resistance. Having an n– implant in the gate conductor 134 and an n– implant in the diffusion regions 140 on the sides of the gate conductor 134, may result in a "degraded resistive response". The exemplary embodiment of FIG. 4 compensates using n+ hybrid implants 460 and the n– implants 440 to improve the resistance of the device.

According to another aspect of the invention, depleted polysilicon capacitor structures may be formed using a hybrid resist. A hybrid photoresist material simultaneously has both a positive tone and a negative tone response to exposure. As a hybrid resist is exposed, areas exposed with high intensity radiation do not develop (they form a negative tone line image). Areas which are unexposed remain insoluble in developer, forming a positive tone line pattern. Areas which are exposed with intermediate amounts of intensity (such as edges) form a space in the resist film during developing. Hybrid photoresist materials are described in U.S. patent application Ser. No. 08/715,288 filed Sep. 16, 1996 and U.S. patent application Ser. No. 08/715,287, filed Sep. 16, 1996, both of which are hereby expressly incorporated by reference herein in their entireties. It is contemplated that other hybrid resist materials that are functionally equivalent to those taught in the application Ser. Nos. 08/715,287 and 08/715,288 may also be used in conjunction with the present invention.

FIG. 4 shows a depleted polysilicon capacitor 400 which has been formed using a hybrid resist for the edge implants. Using the hybrid resist process, a local implant may be placed at the edge of the gate conductor 134. This may be advantageous for applications that do not require high series resistance in series with the decoupling capacitor. The electrical difference between the structures in FIGS. 4–6 compared to FIGS. 1B and 2A is that the capacitor series resistance is lower as well in FIGS. 4–6 using the hybrid resist implant.

To form the depleted polysilicon capacitor 400 of FIG. 4, a hybrid resist (not shown) is formed on the substrate 110 and the gate conductor 134. The hybrid resist is exposed through a mask (not shown). The hybrid resist is developed. Portions of the hybrid resist are removed. A plurality of gate edges are formed in the hybrid resist. A plurality of diffusion regions 460 are formed at the gate edges. A second pair of first conductivity type impurity diffusion regions 440 are formed, having an impurity concentration lower than the impurity concentration of a standard source/drain diffusion region. The second pair of first conductivity type impurity diffusion regions 440 are adjacent to the first pair of first conductivity type impurity diffusion regions 460. At each edge of the n-well region 120, an STI 170 is formed.

The hybrid resist embodiment of FIG. 4 decreases the series resistance of the n– volume. This provides a lower resistance, because there is no n– diffusion region immediately beside the gate conductor 134. The hybrid resist method is an accurate way of reducing the series resistance, because the n+ diffusion regions 460 are self aligned to the gate conductor 134. The n– diffusion regions 440 and the n+ hybrid resist diffusion regions 460 are effectively self aligned. The n– diffusion region 440 is also self aligned to the edge of the edge spacer 136, and the hybrid resist n+ diffusion region 460 is effectively aligned with the same gate edge (either the edge spacer 136 or the edge of the gate conductor 134, depending which is formed first.)

FIGS. 7A to 7I show a series of process steps that may be performed to fabricate a device using the hybrid resist technique of FIG. 4, to form heavily doped implants adjacent to and aligned with the gate structure. More specifically, the steps of FIGS. 7A to 7I may be inserted into the normal fabrication process described above, replacing the step of FIG. 2J, between the step of FIG. 2I and the step of FIG. 2K.

As described above with reference to FIGS. 2D to 2V, FIGS. 7A to 7I show a p-type device and an n-type device next to each other. One of ordinary skill in the art understands that these devices are only shown in this configuration for ease of description. A typical configuration would not include these two devices adjacent to each other.

Elements in FIGS. 7A to 7I that are the same as elements in FIG. 1B or 4 have the same reference numerals, and a description thereof is not repeated below.

Figure 7A:
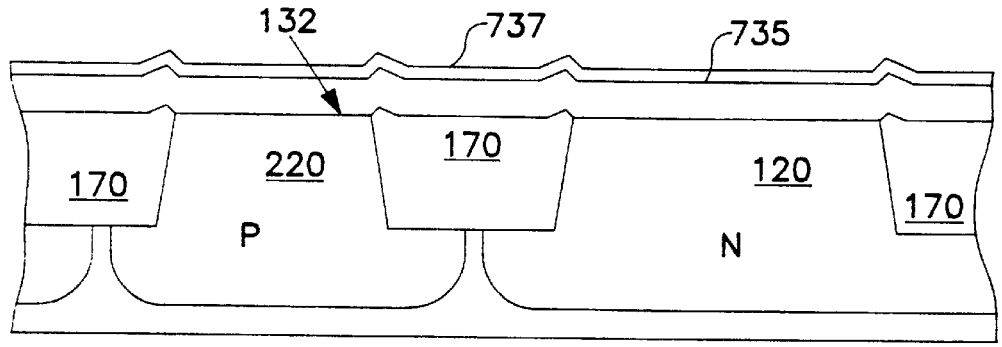
FIGS. 7A to 7I show the process for using a hybrid photoresist to form the n+ layers in a device such as the device shown in FIG. 4.

FIG. 7A shows a process step in which a hardmask layer 737 is deposited over the polysilicon layer 735, before etching the polysilicon layer. The hardmask layer may be, for example, a nitride.

Figure 7B:
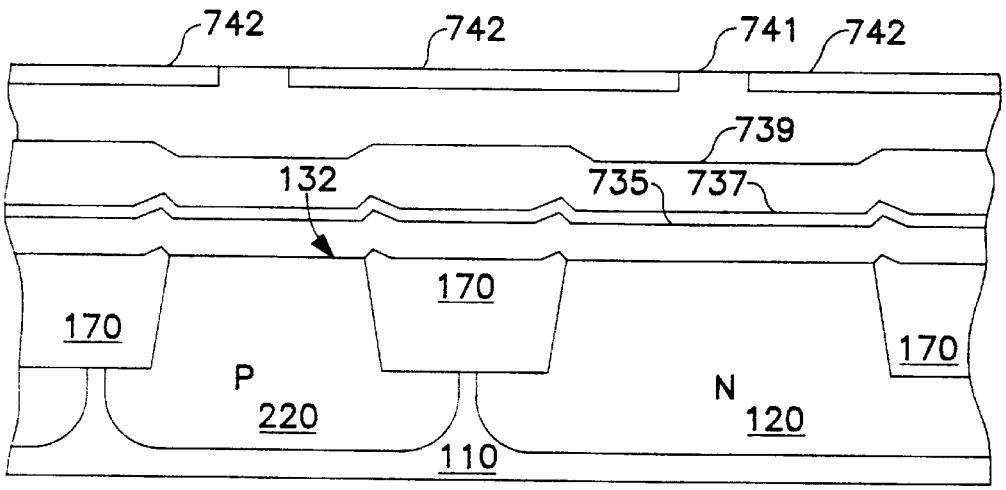

FIG. 7B shows a process step in which a layer of a hybrid resist material 739 is applied over the hardmask 737. A mask 741 having a pattern 742 is placed over the device. The hybrid resist material 739 may be any hybrid resist, such as those described in U.S. patent application Ser. No. 08/715, 288 and No. 08/715,287, both filed on Sep. 16, 1996, both of which are expressly incorporated by reference herein. The only portions of the hybrid resist 739 that are removed at this step are those portions at the edges of the pattern 742, as shown in FIG. 7C.

Figure 7C:
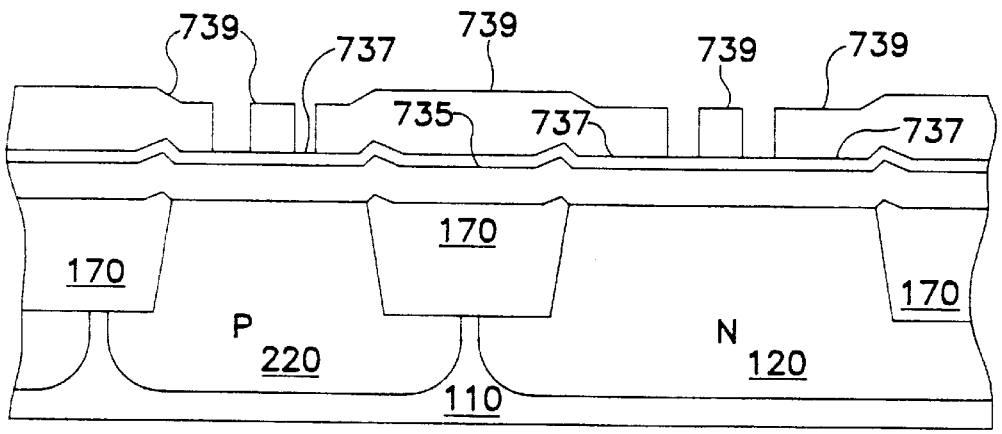

FIG. 7C shows the assembly after the areas of the hybrid resist material 739 exposed to intermediate intensity are removed.

Figure 7D:
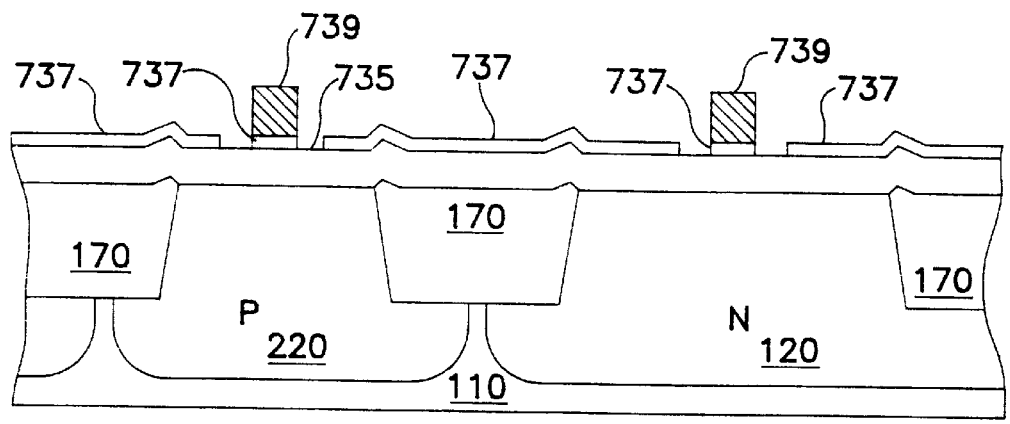

FIG. 7D shows a process step in which the exposed portions of the hardmask 727 are removed by etching. Then, portions of the hybrid resist 739 that were not exposed to radiation are removed.

Figure 7E:
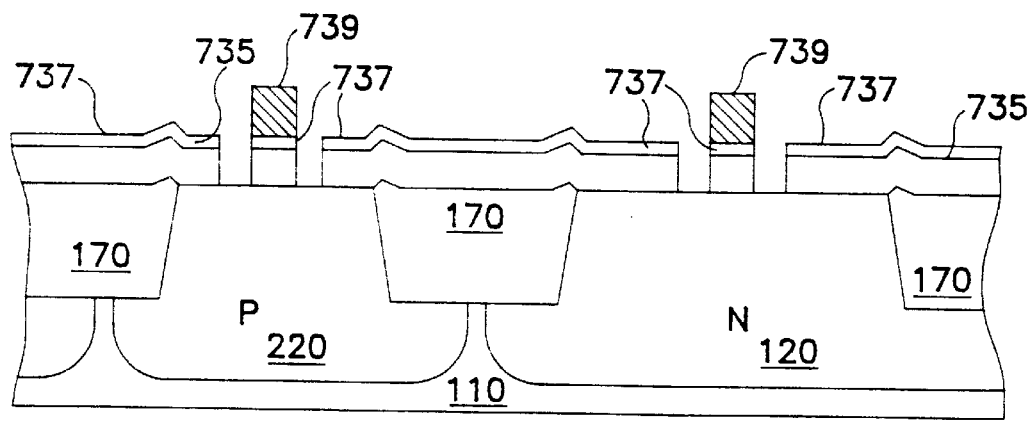

FIG. 7E shows a process step in which the exposed portions of the polycrystalline silicon layer 735 are removed by etching.

Figure 7F:
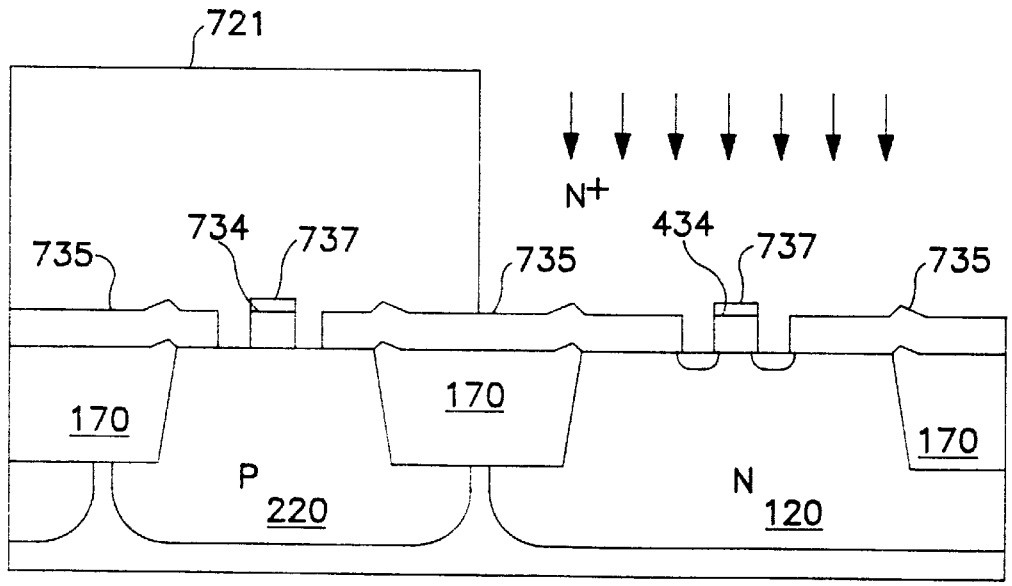

FIG. 7F shows a process step in which the exposed portions of the hardmask 737 are removed. Then, the remaining portions of the hybrid resist 739 (in the regions which are to be gate conductors 134 and 734) are removed. At this point in the process, the polycrystalline silicon film 735 covers the whole device except the holes adjacent to the gates. A photoresist 721 is applied to cover the p type device completely. The n+ diffusion region doping operation is performed to form the n+ diffusion regions 460 (shown in FIG. 7G) adjacent to, and aligned with, the gate conductor 134. The photoresist 721 is then removed.

Figure 7G:
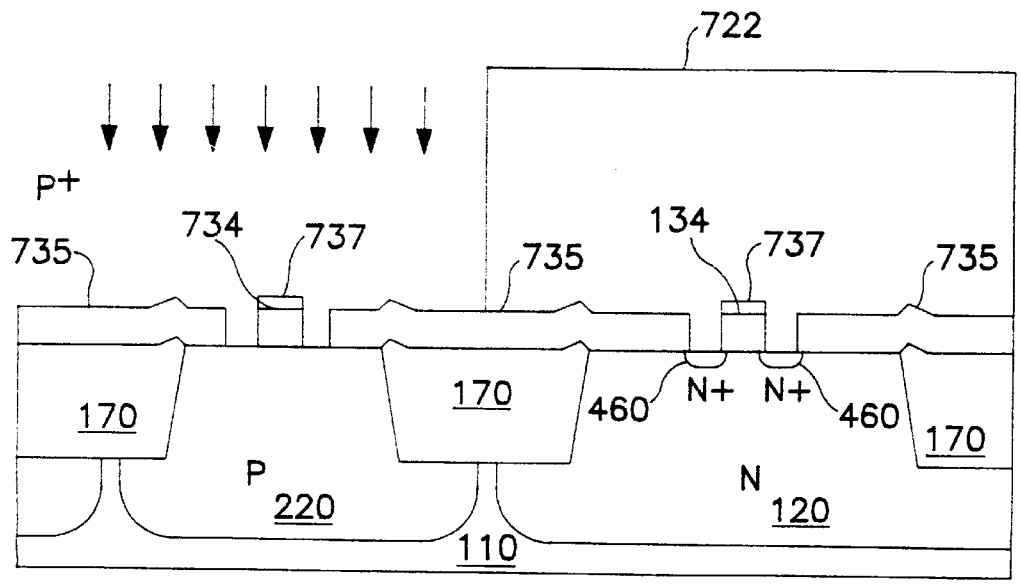
Figure 7H:
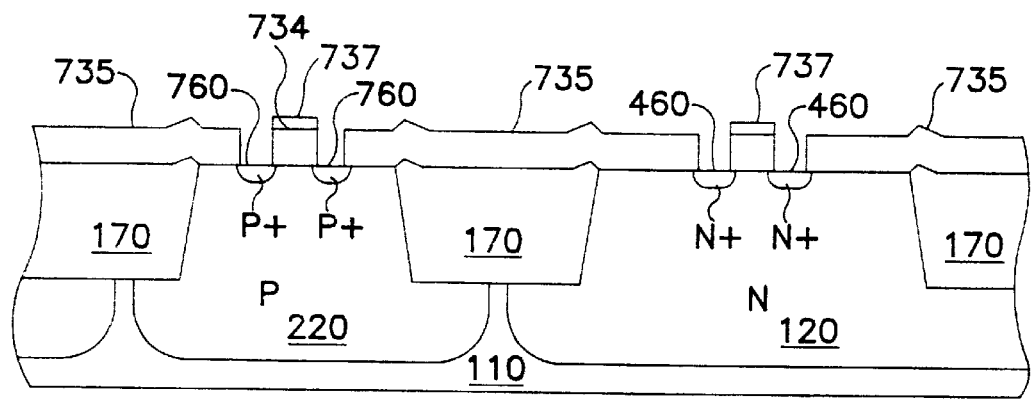

FIG. 7G shows a process step in which a photoresist 722 is applied to cover the n type device completely. The p+ diffusion region doping operation is performed to form the p+ diffusion regions 760 (shown in FIG. 7h) adjacent to, and aligned with, the gate conductor 734. The photoresist 722 is then removed.

Figure 7I:
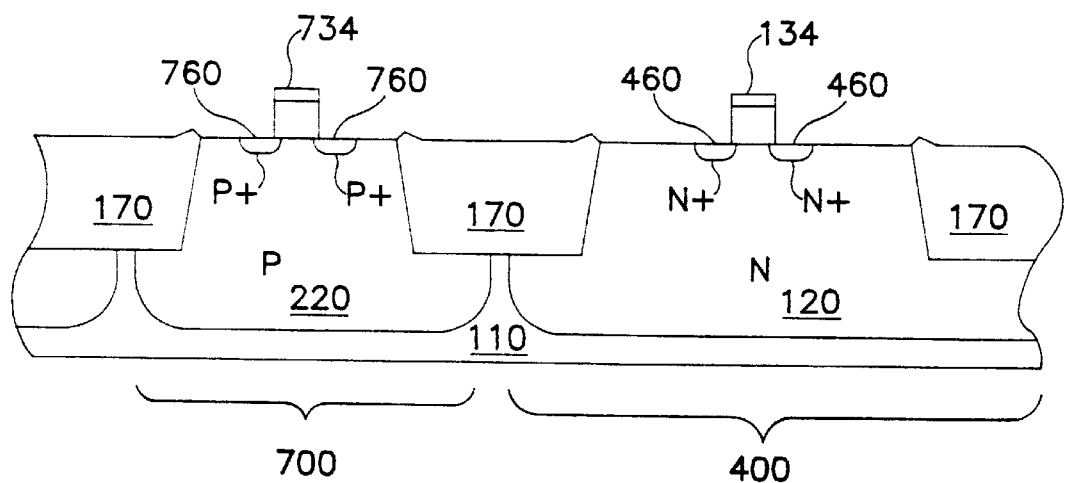

FIG. 7I shows a process step in which the exposed polycrystalline silicon 735 is removed. Then, the remaining hardmask 737 over the gate conductors 134 and 734 is removed. The device is now ready for further processing steps, such as those shown in FIGS. 2K to 2V, and described above.

FIGS. 8A to 8D show an alternative to the step of FIG. 7I. The steps of FIGS. 8A to 8D may be performed to form spacers 737 and 738 over the gate conductor 734, after the step of FIG. 7H, in a hybrid resist implant embodiment of the invention.

Figure 8A:
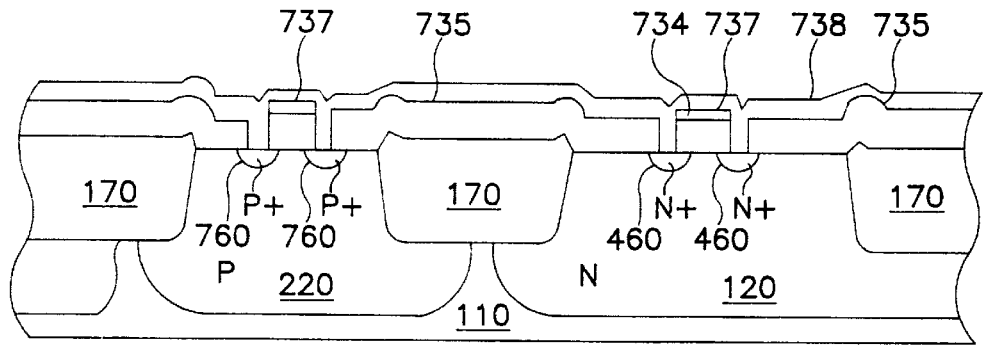
FIGS. 8A to 8D show alternative process steps that may be performed after the step shown in FIG. 7H, as an alternative to the step of FIG. 7I.

FIG. 8A shows a process step in which an oxide film 738 is deposited on the structure.

Figure 8B:
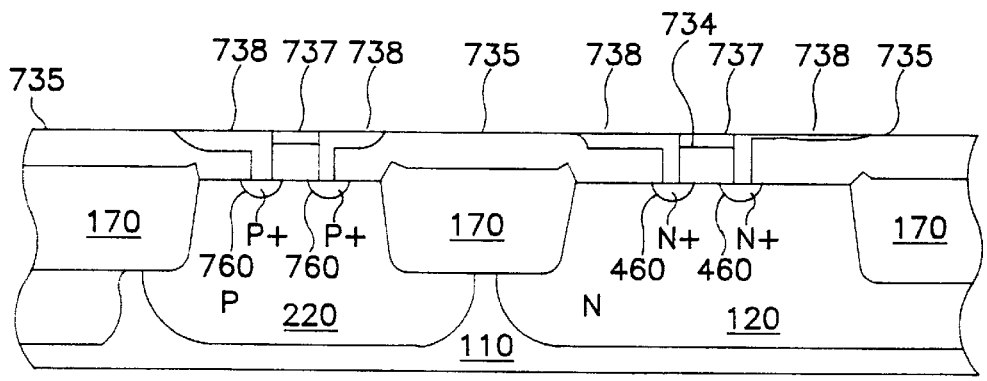

FIG. 8B shows a process step in which the oxide film is planarized by a mechanical operation.

Figure 8C:
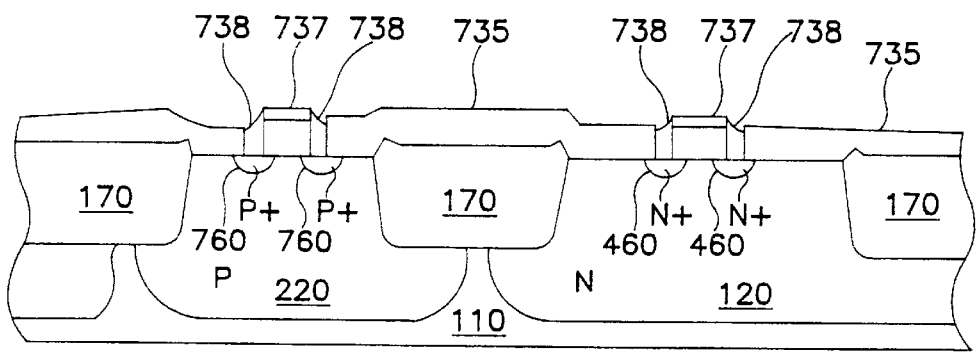

FIG. 8C shows a process step in which the oxide film 738 on the top surface is removed, for example, by etching. The only portion of oxide layer 738 remaining is in the two holes covering the hybrid diffusion regions 460 and 760.

Figure 8D:
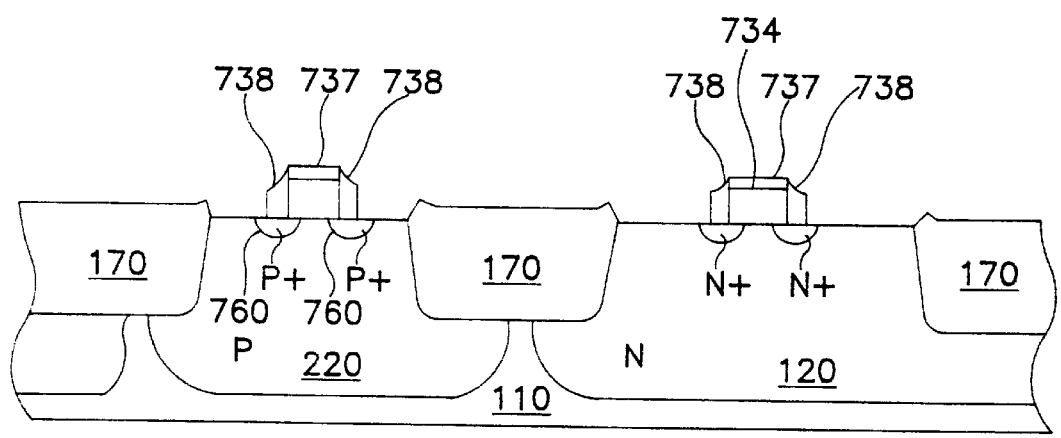

FIG. 8D shows a step in which the exposed polycrystalline silicon 735 is removed, leaving the gates covered by the hardmask 737 and the remaining portions of the oxide layer 738, which now forms edge spacers 738.

FIGS. 5A and 5B show devices which are similar to that shown in FIG. 1B; the difference is that, in FIGS. 4A and 5B, a hybrid resist edge implant 460 is used on the edges adjacent the gate conductor 134. This technique reduces the series resistance on the edges of the device 500. The improved low resistance is significant to achieve a low RC circuit response for the capacitor structure.

FIG. 5A shows a depleted polysilicon capacitor structure 500 which has been formed using a hybrid resist 739 (shown in FIG. 7B) for forming the edge diffusion regions 460. The n+ diffusion regions 460 are adjacent to the edge spacers 136 of gate conductor 134, and the n− diffusion regions 440 are further from the gate conductor 134. Using the hybrid resist process, a local diffusion region may be placed at the edge of the gate conductor 134. This may be advantageous for applications that do not require high series resistance in series with the decoupling capacitor.

FIG. 5B shows a circuit including the capacitor 500 of FIG. 5A and a MOSFET switch 530. The capacitor 500 is formed using the hybrid resist. The MOSFET switch 530 includes a gate conductor 534 and n++ diffusion regions 582 and 584.

FIG. 6 shows a further exemplary embodiment of the invention. According to the embodiment of FIG. 6, a depleted polysilicon capacitor structure 600 is formed on a silicon on insulator (SOI) structure. A buried oxide film 522 is formed in the substrate.

The embodiment of FIG. 6 may be useful in configurations wherein it is deemed undesirable to have an n− diffusion region on the edge of the polycrystalline silicon gate conductor 134, and it is advantageous to have an n+ diffusion region 660 on the side. Therefore, by applying the hybrid resist, the edge implant reduces series resistance. FIG. 6 shows a configuration similar to that of FIG. 4, further comprising a buried oxide layer 522, in an SOT film configuration.

In the device of FIG. 6, with the oxide film at a depth of the junctions themselves, the depth of the wells is on the order of 1 to 3 microns. The junctions are on the order of about 0.2 microns deep. The SOI film 522 is on the order of the junction depth. The film 522 is either at or slightly below the junction depth. The distance from the silicon surface through the depth of the oxide film is about 0.2 to 0.3 microns deep. When the well is only about 0.2 microns thick, it behaves not as a well, but as a resistor. The cross-section is about 0.2 microns thick (substantially less than the 2 micron thickness of a typical well.) Thus, the SOI configuration has roughly ten times higher resistance than a bulk silicon configuration (which has a sheet resistance on the order of about 100 to 1,000 ohms per square.) In the case of SOI, the well region may have a resistance which is about 1,000 to 10,000 ohms per square. In such a configuration, it is advantageous to use the n+ hybrid resist diffusion regions 660, because they reduce the series resistance in the capacitor structure.

In FIG. 6, the n++ diffusion region 680 is the normal source/drain implant dopant concentration. Diffusion region 660 is formed using the hybrid resist implantation technique, and may have a different dopant concentration. And diffusion 640 has the same dopant concentration as the n− gate conductor 134. Essentially, the length of diffusion region 640 may be viewed as a resistor between the n+ diffusion region 660 and the n++ diffusion region 680. Although shown to be relatively shallow, diffusion region 660 could go down to the oxide film 522 if implanted more deeply. Thus, the effective resistance is substantially controlled by the n− diffusion region 640.

The n− implant is put into the gate conductor 134. The n− implant in region 640 is optional, and is preferably used if a greater resistance is desired. The hybrid resist n+ implant region 660 at the gate edge is self aligned to the gate conductor 134, which then decreases the resistance between the gate conductor 134 and n+ diffusion regions 680.

Although the exemplary embodiments have been described for devices using silicon substrates, the invention may be used for other semiconductor materials, such as silicon germanium. Further, any kind of bipolar processing or complementary metal oxide semiconductor (CMOS) process may be used for a device according to the invention. PMOS, NMOS, RF (high frequency) CMOS, and bi-CMOS devices may be fabricated according to the invention.

Moreover, any of the embodiments shown in FIGS. 1A–5B may be configured using SOI technology (i.e., having a buried oxide layer). Each of the above described structures may be formed in both silicon CMOS and SOI technologies. One of ordinary skill can readily construct an SOI device having the doped regions and Shallow Trench Isolation (STI) regions 170 shown in the exemplary embodiments of FIGS. 1B, 2A, and 3, which do not use the hybrid resist 739. To reduce the series resistance, large square plates would not be used and gate lengths would be kept to a minimum. Gates would be shaped as fingered structures instead of rectangles.

The physical dimensions for an SOI design may be very different from those used for CMOS. The coupling capacitors for a standard CMOS technology might be 100×100 $\mu m^2$ capacitor, yielding a high series resistance under the dielectric film. SOI embodiments may include 100 "fingers" which are 1 micron wide because of the large series resistance.

The choice of SOI versus CMOS depends on the desired resistance. The capacitor on an SOI film tends to provide a higher resistance. For lower resistance, it may be preferable to use hybrid resist implants or increased well doping.

Although the exemplary devices include Shallow Trench Isolation (STI) regions 170, one of ordinary skill understands that the isolation regions may use other known isolation technologies, such as LOCOS (Local Oxide Isolation), ROX (Recessed Oxidation), SROX, polybuffer LOCOS, and the like.

Figure 9:
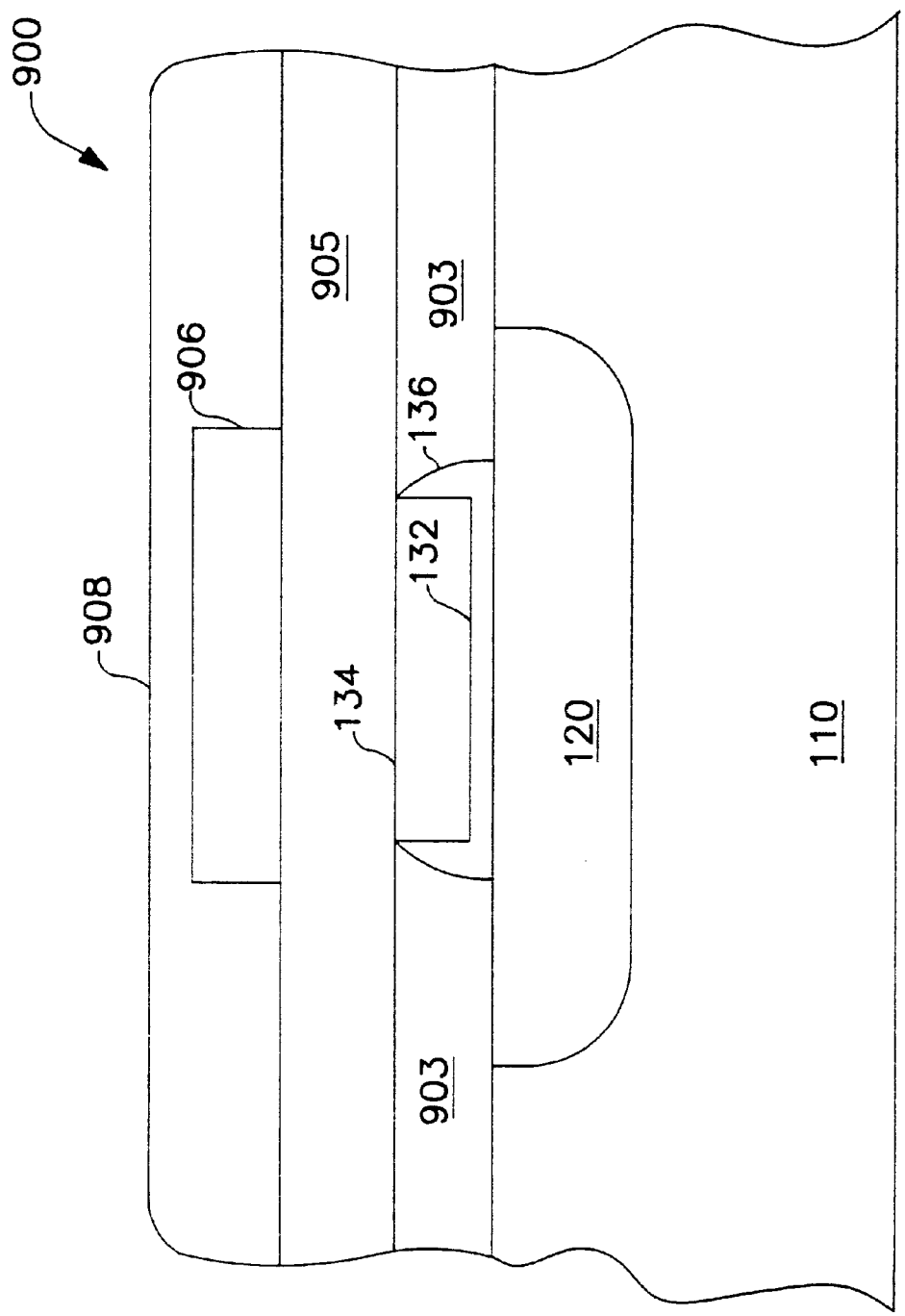
FIG. 9 shows a further aspect of the invention.

FIG. 9 shows another embodiment of the present invention. According to another aspect of the invention, a highly voltage-tolerant capacitor element is provided.

A capacitor element 900 comprises an STI region 120 of a substrate or well region 110 with a first dielectric film 132 (which may be a thin oxide film) formed on its surface. A first polycrystalline silicon conductor 134 is formed on the first dielectric film 132. A second dielectric film 905 is formed on the first polycrystalline silicon conductor 134. A second polycrystalline silicon conductor 906 is formed on the second dielectric film 905. Either the first polycrystalline silicon conductor 134 or the second polycrystalline silicon conductor 906 has an impurity concentration substantially lower than a standard impurity concentration for the gate conductor of an MOS device. A further insulating film 908 is formed on the second polycrystalline silicon conductor 906.

In the embodiment of FIG. 9, the first polycrystalline silicon conductor 134 has an impurity concentration substantially lower than a standard impurity concentration for the gate conductor of an MOS device, and the second polycrystalline silicon conductor 906 has an impurity concentration equal to or substantially higher than a standard impurity concentration for the gate conductor of an MOS device. The resulting structure includes two stacked capacitors in series.

By providing a lightly doped polycrystalline silicon conductor 134, when a voltage is applied to conductor 906, the electric field penetrates into the conductor 134. This creates polysilicon depletion on both top and bottom of the lightly doped polycrystalline silicon conductor 134. An advantage of the depleted capacitor structure is that the electric field across the polycrystalline silicon conductor 134 is lower, avoiding overvoltage.

An advantage of the method of fabricating the structure shown in FIG. 9 is that no extra masks are required beyond the masks described above with reference to the embodiments of FIGS. 1A–8D.

The polycrystalline silicon—depleted polycrystalline silicon construction may, for example, be used in such applications as: non-volatile random access memory (NVRAM), high-voltage applications between a power rail (Vdd) and ground; circuit applications; ESD circuitry, decoupling capacitors; peripheral I/O circuitry; and power grid applications, EVS and DVS. These applications are exemplary, and are not exclusive.

Figure 10:
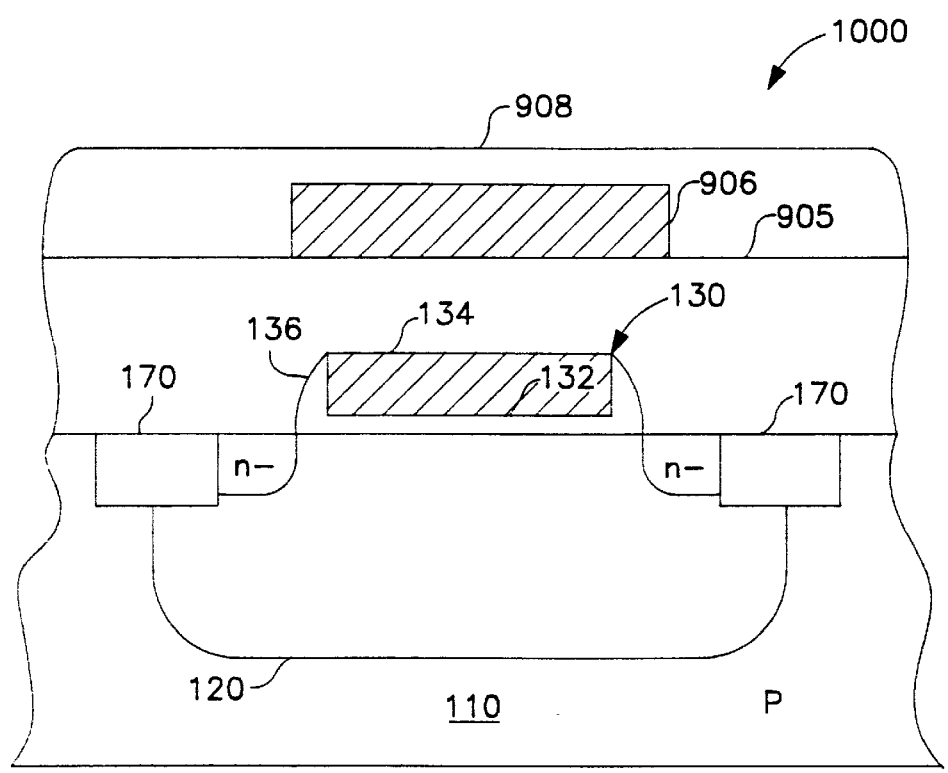
FIG. 10 shows an example of the device shown in FIG. 9.

FIG. 10 shows another embodiment A capacitor element 1000 comprises a semiconductor substrate 110 having a surface with a first dielectric film 132 formed on the surface of the substrate 110. A first polycrystalline silicon conductor 134 is formed on the first dielectric film 132. A second dielectric film 905 is formed on the first polycrystalline silicon conductor 134. A second polycrystalline silicon conductor 906 is formed on the second dielectric film 905. A second insulating film 908 is formed on the second polycrystalline silicon conductor 906. Either the first polycrystalline silicon conductor 134 or the second polycrystalline silicon conductor 906 has an impurity concentration substantially lower than a standard impurity concentration for the gate conductor of an MOS device.

In the embodiment of FIG. 10, the first polycrystalline silicon conductor 134 has an impurity concentration substantially lower than a standard impurity concentration for the gate conductor of an MOS device, and the second polycrystalline silicon conductor 1002 has an impurity concentration substantially higher than a standard impurity concentration for the gate conductor of an MOS device.

Figure 11:
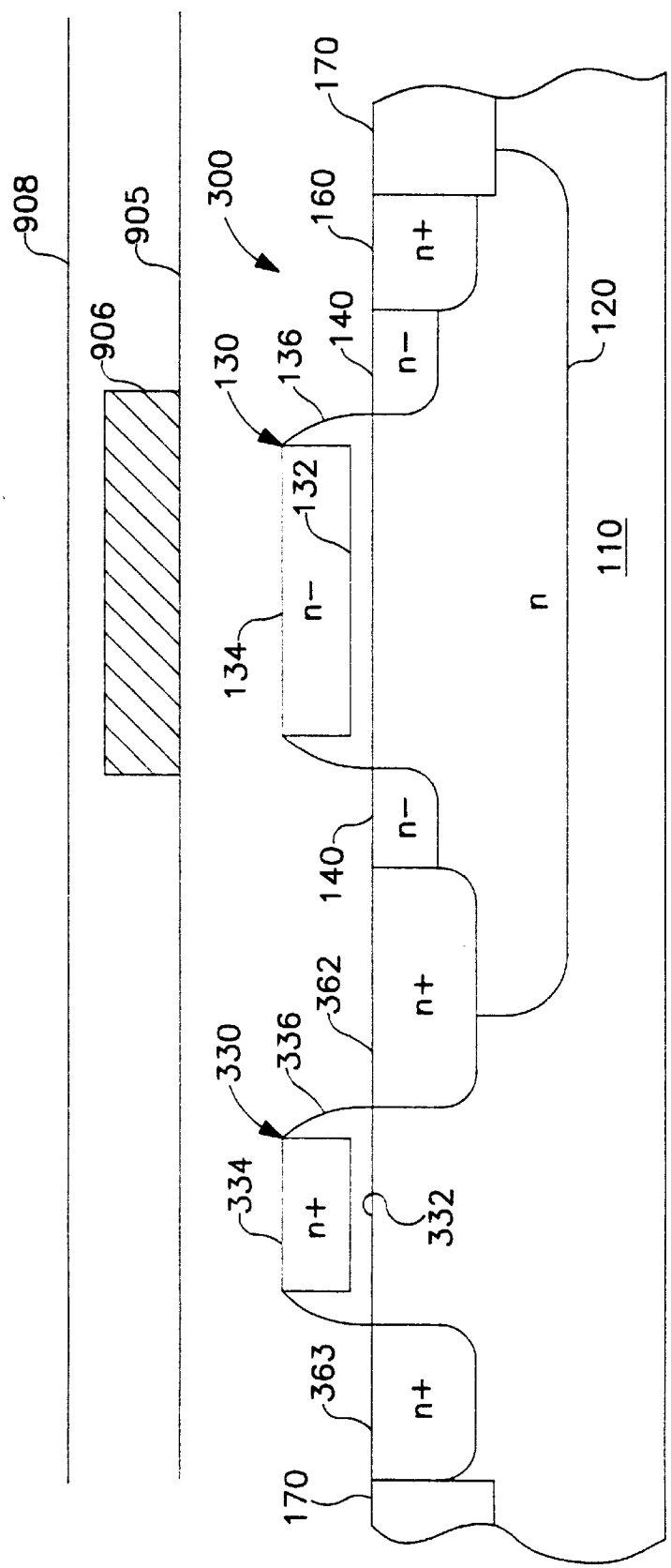
FIG. 11 shows a variation of the device shown in FIG. 3, further comprising the structure shown in FIG. 9.

FIG. 11 shows a further variation of the exemplary embodiment of FIG. 3. FIG. 11 includes the n-channel MOSFET source/drain implant with the low doped implant and an n-channel MOSFET electronic switch, as shown in FIG. 3. Elements in FIG. 11 that are the same as elements in FIG. 3 have the same reference numeral. A well region 120 of a same conductivity type as the first polycrystalline silicon conductor 134 is formed in the surface of the substrate 110 beneath the first dielectric film 132. A capacitor element 300 is provided in and on the well region 120. In FIG. 11, the inner pair of impurity diffusion regions 140 adjacent the dielectric film 132 has an impurity concentration substantially lower than the standard impurity concentration for the gate conductor of an MOS device, and the outer pair of impurity diffusion regions 160, 362 has an impurity concentration substantially higher.

A resistor 362 is formed on the substrate and connected to the capacitor element 300. A MOSFET 330 is formed on the substrate 110. MOSFET 330 has a gate input 334 that is connected to the resistor 362 and the capacitor element 300.

An insulating layer 905 is deposited on the structure comprising capacitor 300 and MOSFET 330. A second polycrystalline silicon conductor 906 is deposited on the second insulating layer 905. A further insulating film 908 is then deposited. The structure shown in FIG. 11 includes a high voltage decoupling capacitor structure 906, 134. The polycrystalline silicon gate conductor 134 is deposited as an intrinsic polysilicon. Impurities are then implanted in the gate conductor 134 so that the dopant concentration in conductor 134 is substantially below that of the standard source/drain implant. An advantage of the depleted capacitor structure is that the electrical field across the gate dielectric 132 is lower, avoiding overvoltage during either ESD or operation.

Figure 12:
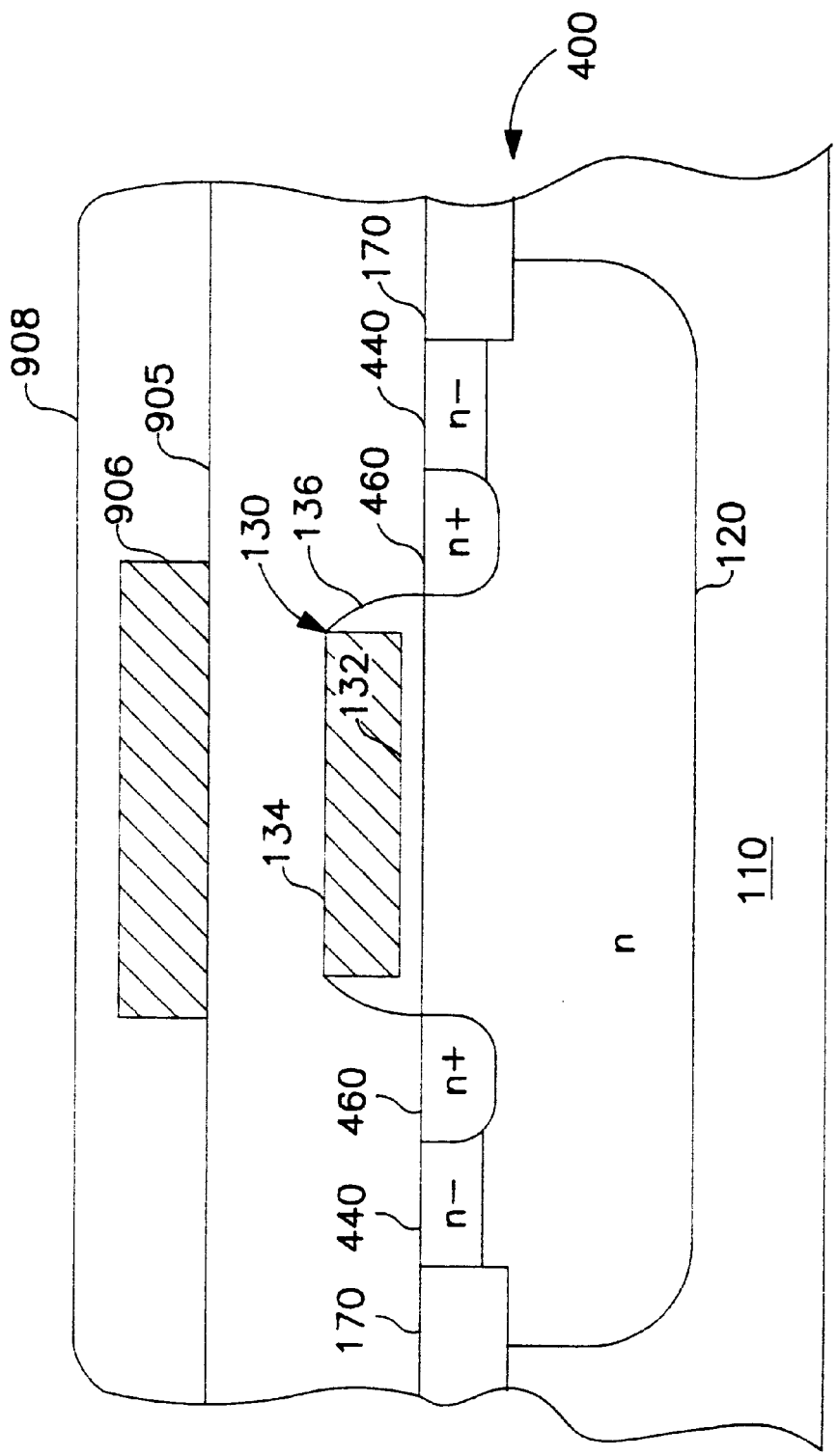
FIG. 12 shows a variation of the device shown in FIG. 4, further comprising the structure shown in FIG. 9.

FIG. 12 shows a further aspect of the invention. The construction of FIG. 12 is similar to the device 400 shown in FIG. 4, which is formed using the hybrid resist process. In FIG. 12, the inner pair of impurity diffusion regions 460 adjacent the dielectric film 132 has an impurity concentration substantially higher than the standard impurity concentration for the gate conductor of an MOS device, and the outer pair of impurity diffusion regions 440 has an impurity concentration substantially lower.

The device of FIG. 12 further comprises an insulation layer 905 formed on top of the capacitor structure 400, a second polycrystalline silicon conductor 906 on top of the insulation layer 905, and a further insulation layer 908 formed on top of the second polycrystalline silicon conductor 906. Thus, the dual-polycrystalline-silicon-conductor construction 134, 906 may be used in the lower series resistance hybrid resist configuration of FIG. 12 or the higher series resistance configuration of FIG. 11.

Figure 13:
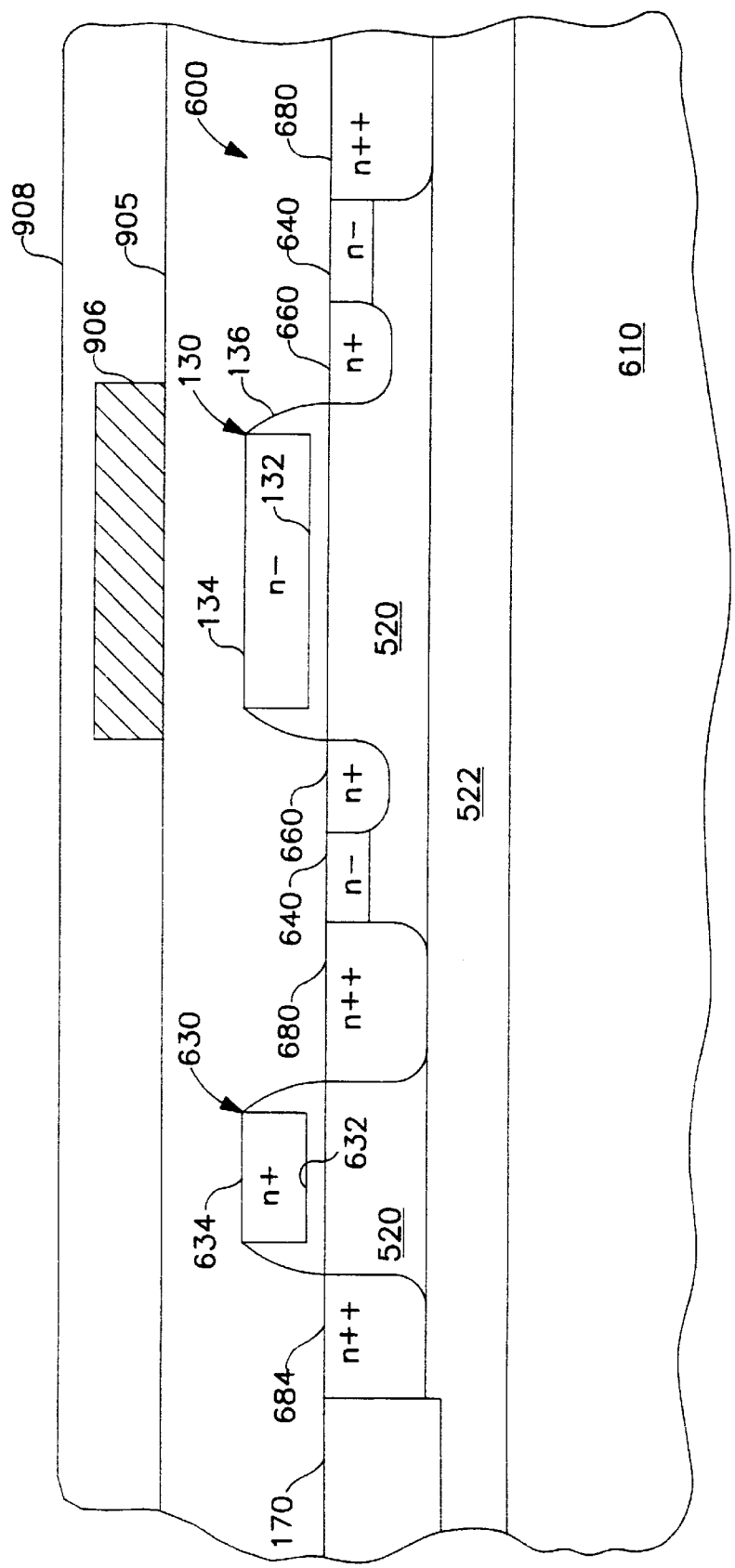
FIG. 13 shows a variation of the device shown in FIG. 6, further comprising the structure shown in FIG. 9.

FIG. 13 shows a further variation of the exemplary embodiment of FIG. 6, using the SOI structure. The substrate 610 has a buried oxide layer 522 beneath the well region 520. A capacitor element 600 similar to that shown in FIG. 6 is formed. Then an insulating layer 905 is deposited on the structure comprising capacitor 300 and MOSFET 330. A second polycrystalline silicon conductor 906 is deposited on the second insulating layer 905. A further insulating film 908 is then deposited. A resistor 680 is formed on the substrate and connected to the capacitor element 600. A MOSFET 630 is formed on the substrate 520, The MOSFET 630 is connected to the resistor 680 and the capacitor element 600.

Although the invention has been described with reference to exemplary embodiments, it is not limited thereto. Rather, the appended claims should be construed to include other variants and embodiments of the invention which may be made by those skilled in the art without departing from the true spirit and scope of the present invention.

What is claimed is:

1. A circuit element comprising:
    a semiconductor substrate having a surface;
    a well region of a first conductivity type formed in the surface of the substrate;
    a dielectric film formed on the surface of the substrate;
    a gate conductor of the first conductivity type formed on the dielectric film over the well region of the substrate, the gate conductor being formed of a polycrystalline silicon film, the gate conductor having an impurity concentration, formed by a doping implant dos less than $3\times10^{15}/cm^2$, for a concentration of less than about $1\times10^{20}/cm^3$ to cause the gate conductor to deplete upon voltage biasing and thereby reducing voltage stress across the dielectric film;

a polycrystalline silicon edge spacer on each side of the gate conductor and contacting the surface of the well region;

a first pair of first conductivity type impurity diffusion regions formed adjacent to the polycrystalline silicon edge spacers, said polycrystalline silicon film and edge spacers lying on a portion of the substrate between the first pair of first conductivity type impurity diffusion regions;

a second pair of first conductivity type impurity diffusion regions formed in the surface of said substrate, said first pair of first conductivity type impurity diffusion regions being located between the second pair of first conductivity type impurity diffusion regions; and a respective isolation region on each side of the polycrystalline silicon film, each isolation region lying between one of the first pair of first conductivity type impurity diffusion regions and one of the second pair of first conductivity type impurity diffusion regions and in contact with both regions.

2. The circuit element according to claim 1, wherein the first pair of first conductivity type impurity diffusion regions have an impurity concentration that is a doping implant dose less than $3 \times 10^{15}/cm^2$ for a concentration less than $1 \times 10^{20}/cm^3$.

3. The circuit element according to claim 2, wherein the gate conductor and the first pair of first conductivity type impurity diffusion regions are formed by a single implantation step.

4. The circuit element according to claim 1, further comprising first and second electrodes coupled to first and second ones of the second pair of first conductivity type impurity diffusion regions, respectively, thereby forming a resistor between the first and second electrodes.

5. The circuit element according to claim 1, further comprising an electrode coupled to one of the second pair of first conductivity type impurity diffusion regions, thereby forming a capacitor element between the gate conductor and one of the group consisting of the well region and the substrate.

6. The circuit element according to claim 1, wherein the second pair of first conductivity type impurity diffusion regions have an impurity concentration that is a doping implant dose greater than $3 \times 10^{15}/cm^2$ for a concentration greater than $1 \times 10^{20}/cm^3$.

7. The circuit element according to claim 6, wherein the second pair of first conductivity type impurity diffusion regions are source and drain regions, each adjacent to a respective one of the first pair of first conductivity type impurity diffusion regions.

8. The circuit element according to claim 1, wherein the first pair of first conductivity type impurity diffusion regions have an impurity concentration that is a doping implant dose greater than $3 \times 10^{15}/cm^2$ for a concentration greater than $1 \times 10^{20}/cm^3$.

9. The circuit element according to claim 8, further comprising first and second electrodes coupled to first and second ones of the first pair of first conductivity type impurity diffusion regions, respectively, thereby forming a resistor between the first and second electrodes.

10. The circuit element according to claim 8, further comprising an electrode coupled to one of the first pair of first conductivity type impurity diffusion regions, thereby forming a capacitor element between the gate conductor and one of the group consisting of the well region and the substrate.

11. The circuit element according to claim 1, wherein the substrate has a buried oxide layer beneath the well region.

12. A circuit comprising:
a circuit element according to claim 1;
a resistor formed on the substrate and connected to the circuit element; and
a MOSFET formed on the substrate and having a gate input that is connected to the resistor and the circuit element.

13. A circuit comprising:
a circuit element according to claim 1, wherein the substrate has a buried oxide layer beneath the well region;
a resistor formed on the substrate and connected to the circuit element; and
a MOSFET formed on the substrate and having a body that is connected to the resistor and the circuit element.

14. A circuit comprising:
a circuit element according to claim 1, wherein the substrate has a buried oxide layer beneath the well region;
a resistor formed on the substrate and connected to the circuit element; and
a MOSFET formed on the substrate and having a gate that is connected to the resistor and the circuit element.

15. The circuit according to claim 14, wherein the MOSFET has a body that is connected to the resistor and the circuit element.

* * * * *

UNITED STATES PATENT AND TRADE MARK OFFICE
CERTIFICATE OF CORRECTION

PATENT NO.    : 6,034,388
DATED         : March 7, 2000
INVENTOR(S)   : Jeffrey S. Brown, et al.

It is certified that error appears in the above-identified patent and that said Letters Patent is hereby corrected as shown below:

On the cover page. section 56, delete "5,760,043" insert --5,760,435--;

Column 9, line 14, delete "20" and insert --2O--;

Column 11, line 62, delete "2D" and insert --2B--;

Column 13, line 4, delete "4A" and insert --5A--;

Column 15, line 26, after the word embodiment insert --a period and two spaces--;

Column 16, line 63, delete "dos" and insert --does--.

Signed and Sealed this

Tenth Day of April, 2001

Attest:

NICHOLAS P. GODICI

Attesting Officer      Acting Director of the United States Patent and Trademark Office

UNITED STATES PATENT AND TRADEMARK OFFICE
CERTIFICATE OF CORRECTION

PATENT NO. : 6,034,388
DATED : March 7, 2000
INVENTOR(S) : Jeffrey S. Brown, et al.

It is certified that error appears in the above-identified patent and that said Letters Patent is hereby corrected as shown below:

Column 16, claim 1,
Line 63, delete "does" and insert -- dose --.

Signed and Sealed this

Second Day of October, 2001

Attest:

*Nicholas P. Godici*

NICHOLAS P. GODICI
*Acting Director of the United States Patent and Trademark Office*

*Attesting Officer*